United States Patent
Rogers

(10) Patent No.: US 10,320,336 B2
(45) Date of Patent: Jun. 11, 2019

(54) OUTPUT POWER CELL FOR CASCODE AMPLIFIERS

(71) Applicant: SKYWORKS SOLUTIONS, INC., Woburn, MA (US)

(72) Inventor: John William Mitchell Rogers, Nepean (CA)

(*) Notice: Subject to any disclaimer, the term of this patent is extended or adjusted under 35 U.S.C. 154(b) by 0 days.

(21) Appl. No.: 15/677,327

(22) Filed: Aug. 15, 2017

(65) Prior Publication Data

US 2018/0062580 A1 Mar. 1, 2018

Related U.S. Application Data

(60) Provisional application No. 62/378,605, filed on Aug. 23, 2016.

(51) Int. Cl.
| | |
|---|---|
| H03F 1/22 | (2006.01) |
| H03F 3/21 | (2006.01) |
| H03F 3/19 | (2006.01) |
| H03F 1/56 | (2006.01) |
| H03F 1/32 | (2006.01) |
| H03F 3/191 | (2006.01) |
| H03F 3/24 | (2006.01) |
| H03F 3/45 | (2006.01) |
| H03F 3/72 | (2006.01) |

(52) U.S. Cl.
CPC .............. *H03F 1/22* (2013.01); *H03F 1/3241* (2013.01); *H03F 1/56* (2013.01); *H03F 3/19* (2013.01); *H03F 3/191* (2013.01); *H03F 3/21* (2013.01); *H03F 3/211* (2013.01); *H03F 3/245* (2013.01); *H03F 3/45089* (2013.01); *H03F 3/72* (2013.01); *H03F 2200/111* (2013.01); *H03F 2200/222* (2013.01); *H03F 2200/318* (2013.01); *H03F 2200/387* (2013.01); *H03F 2200/411* (2013.01); *H03F 2200/451* (2013.01); *H03F 2203/21145* (2013.01); *H03F 2203/7209* (2013.01)

(58) Field of Classification Search
CPC . H03F 1/22; H03F 1/223; H03F 1/226; H03F 3/68
USPC .................................................. 330/295, 311
See application file for complete search history.

(56) References Cited

U.S. PATENT DOCUMENTS

| | | | |
|---|---|---|---|
| 2002/0130720 A1* | 9/2002 | Pavio | ........................ H03F 3/607 330/286 |
| 2014/0266461 A1* | 9/2014 | Youssef | ........................ H03F 3/68 330/295 |

* cited by examiner

*Primary Examiner* — Steven J Mottola
(74) *Attorney, Agent, or Firm* — Chang & Hale LLP

(57) ABSTRACT

A cascode power cell for a power amplifier circuit includes a radio frequency signal input node, a radio frequency signal output node, and a plurality of sub-cells each including a first transistor having a collector coupled to the radio frequency signal output node, each of the plurality of sub-cells further including a second transistor having a collector coupled to an emitter of the first transistor at a connection node, and a base coupled to the radio frequency signal input node, the connection nodes for each of the plurality of sub-cells being electrically isolated from one another.

17 Claims, 19 Drawing Sheets

OUTPUT POWER CELL FOR CASCODE AMPLIFIERS

CROSS-REFERENCE TO RELATED APPLICATION(S)

This application claims priority to U.S. Provisional Application No. 62/378,605, filed Aug. 23, 2016, and entitled OUTPUT POWER CELL FOR CASCODE AMPLIFIERS, the disclosure of which is hereby incorporated by reference in its entirety.

BACKGROUND

Field

The present disclosure relates to radio-frequency signal processing.

Description of the Related Art

Amplifier devices can be used in processing radio-frequency signals. Certain amplifier devices can suffer from non-uniform current draw, which may affect system performance and/or result in damage to the amplifier device.

SUMMARY

In accordance with some implementations, the present disclosure relates to a cascode power cell for a power amplifier circuit. The cascode power cell comprises a radio frequency signal input node, a radio frequency signal output node, and a plurality of sub-cells each including a first transistor having a collector coupled to the radio frequency signal output node. Each of the plurality of sub-cells further includes a second transistor having a collector coupled to an emitter of the first transistor at a connection node, and a base coupled to the radio frequency signal input node. The connection nodes for each of the plurality of sub-cells are electrically isolated from one another.

The second transistor of each of the plurality of sub-cells may include an emitter coupled to a resistor at an emitter node, the emitter nodes for the second transistors of the plurality of sub-cells being electrically isolated from each other. The electrical isolation between the connection nodes of the plurality of sub-cells may allow the second transistors of the plurality of sub-cells to control current flow through the cascode power cell. In certain embodiments, the electrical isolation between the connection nodes of the plurality of sub-cells prevents current hogging by a subset of the plurality of sub-cells. The first transistor of each of the plurality of sub-cells may be a common-base transistor. The first transistor of each of the plurality of sub-cells may include a base coupled to a capacitor. In certain embodiments, the plurality of sub-cells includes eight sub-cells, or ten sub-cells.

In some implementations, the present disclosure relates to a cascode power amplifier circuit comprising a radio frequency signal input node, a radio frequency signal output node, and a power amplifier core including a plurality of sub-cells each including a first transistor having a collector coupled to an amplifier input node. Each of the plurality of sub-cells may further include a second transistor having a collector coupled to an emitter of the first transistor at a connection node, and a base coupled to an amplifier output node, the connection nodes for each of the plurality of sub-cells being electrically isolated from one another. The second transistor of each of the plurality of sub-cells may include an emitter coupled to a resistor at an emitter node, the emitter nodes for the second transistors of the plurality of sub-cells being electrically isolated from each other. In certain embodiments, the first transistor of each of the plurality of sub-cells is a common-base transistor. The first transistor of each of the plurality of sub-cells may include a base coupled to a capacitor. In certain embodiments, the plurality of sub-cells includes eight sub-cells, or ten sub-cells. The electrical isolation between the connection nodes of the plurality of sub-cells may allow the second transistors of the plurality of sub-cells to control current flow through the power amplifier core.

In some implementations, the present disclosure relates to a radio-frequency module comprising a power amplifier including a plurality of sub-cells each including a first transistor having a collector coupled to an amplifier input node, each of the plurality of sub-cells further including a second transistor having a collector coupled to an emitter of the first transistor at a connection node, and a base coupled to an amplifier output node, the connection nodes for each of the plurality of sub-cells being electrically isolated from one another. The second transistor of each of the plurality of sub-cells may include an emitter coupled to a resistor at an emitter node, the emitter nodes for the second transistors of the plurality of sub-cells being electrically isolated from each other. In certain embodiments, the first transistor of each of the plurality of sub-cells is a common-base transistor. The first transistor of each of the plurality of sub-cells may include a base coupled to a capacitor. The electrical isolation between the connection nodes of the plurality of sub-cells may allows the second transistors of the plurality of sub-cells to control current flow through the power amplifier.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DESCRIPTION

Figure 1:
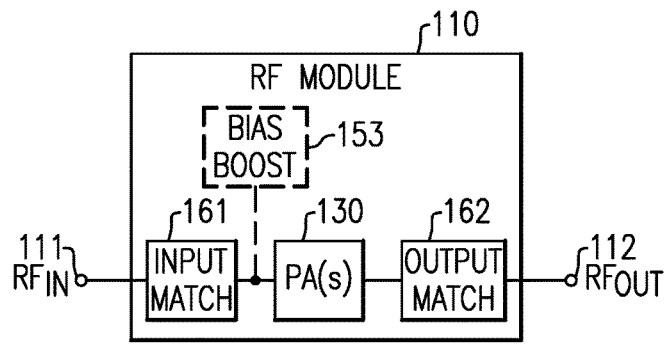
FIG. 1 is a block diagram illustrating a radio frequency (RF) module according to one or more embodiments.

The headings provided herein are for convenience only and do not necessarily affect the scope or meaning of the claimed invention.

In certain implementations, the present disclosure relates to systems, devices and methods utilizing power amplifier (PA) modules. In radio frequency (RF) communication circuits, relatively high-power amplifiers may be used to increase the strength of a transmitted signal. Various power amplifier designs and topologies are disclosed herein, including cascode PAs, such as 5 GHz cascode PA designs.

Increasing demand for wireless communication devices, as well as the demand for increasing through-put in such devices, has led to the development of more and more sophisticated modulation schemes requiring increasingly strict RF performance parameters. While many wireless processing components comprise circuitry utilizing complementary metal-oxide-semiconductor (CMOS) technology, including field effect transistors (FETs; e.g., metal oxide field effect transistors (MOSFETs)), certain RF components may implement power amplifier(s) comprising bipolar junction transistors (BJTs), such as RF power amplifiers (PAs) and/or low-noise amplifiers (LNAs), which may be implemented in front end modules (FEMs), for example. RF power amplifiers often operate near saturation levels, and can suffer from various nonlinear effects that can degrade performance. The nonlinear effects of an amplifier at a specified frequency may be quantified by the AM-AM and AM-PM distortion; that is, the amplitude and phase modulations or distortions as functions of the amplitude of the input signal.

Disclosed herein are certain power amplifier topologies and designs, which may be implemented in, for example, 5 GHz-band WiLAN applications. For example, cascode power amplifier topologies are described herein, which may provide an alternative to standard common-emitter (CE) power amplifier topologies. Cascode power amplifiers may offer relatively high gain, which may allow for designs having relatively few amplifier stages and/or improved dynamic error vector magnitude (EVM) due to relatively low power consumption in the gain controlling device.

Cascode power amplifier may generally be considered to comprise two transistor stages, a driver transistor stage and a cascode transistor stage. In certain embodiments, one or both of the transistor stages may be built using an array of smaller transistor cells. Each transistor cell may include both a common emitter device (e.g., driver transistor) and a common base device (e.g., cascode transistor). In certain embodiments, the common emitter device at least partially controls the current through the cell, while the relatively high-power common base device may deliver the desired power.

Certain cascode power amplifier designs can suffer from current hogging effects by one or more transistor sub-cells of a larger transistor array. Such effects may be due at least in part to the relative overheating of one part (e.g., sub-cell, or collection of sub-cells) of a transistor array that makes up a component of a power amplifier (e.g., cascode power amplifier) relative to other portion(s) of the transistor array, resulting in relatively more electrical current being drawn by the hotter portion of the transistor array. Such current hogging and/or overheating may lead to device damage and/or sub-optimal performance. It may therefore be desirable to manage current draw throughout a transistor array, such as by managing relative overheating in the transistor array. Certain embodiments disclosed herein provide for at least partial management of temperature and/or current uniformity throughout transistor arrays of driver and cascode stages of a cascode power amplifier circuit through electrical isolation between sub cells of a transistor array to reduce or prevent current redistribution.

FIG. 1 shows that, in some embodiments, a radio frequency (RF) module 110 can include one or more power amplifiers 130. The power amplifier(s) 130 may be connected between an RF input terminal 111 of the RF module 110 and an RF output terminal 112. In certain implementations, one or more of the power amplifier(s) 130 comprises a cascode power amplifier including at least two transistors, a driver transistor and a cascode transistor, wherein a collector of the driver transistor is coupled to an emitter of the cascode transistor. In addition, the power amplifier module 130 may comprise multiple amplifier stages, such as multiple cascode amplifier stages. The power amplifier(s) 130 may be powered by a supply voltage (e.g., 5 V supply) via a supply terminal (not shown).

The RF signal to be amplified may be received by the RF module 110 and provided to the power amplifier(s) 130 via an input impedance matching component 161, wherein the amplified version of the RF signal is provided to an output terminal 112 of the RF module 110 via an output impedance matching component 162. Thus, the input impedance matching component 161 is disposed between the RF input terminal 111 and the power amplifier input terminals and the output impedance matching component is disposed between the power amplifier output terminals and the RF output terminal 112. The input matching component 161 may be configured to match, for example, 50 ohms, to an impedance value that it may be desirable for the power amplifier module 130 to see. The output matching component 162 may be configured to adjust the low line of the power amplifier module 130.

Although certain embodiments are disclosed herein in the context of multi-stage (e.g., including a driver stage and an output stage) cascode power amplifiers, it should be understood that the various power amplifiers and power amplifier modules disclosed herein may include different types of power amplifiers, such as one or more single-transistor amplifiers, one or more single-stage amplifiers, one or more Doherty amplifiers, or other types of power amplifiers.

Figure 2:
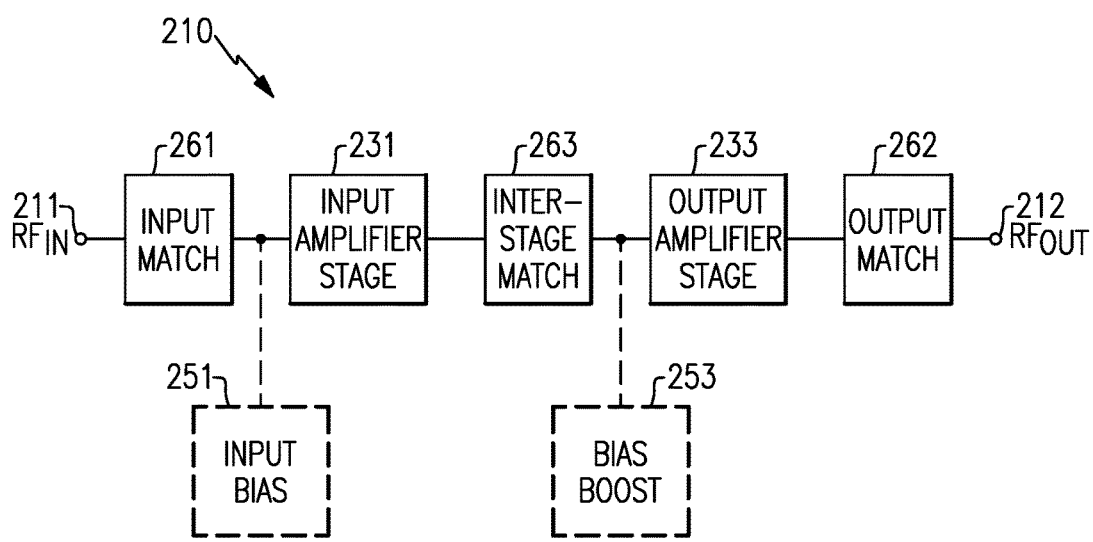
FIG. 2 is a block diagram illustrating RF circuitry providing RF amplification according to one or more embodiments.

FIG. 2 is a block diagram illustrating radio-frequency (RF) circuitry 210 providing RF amplification according to one or more embodiments. The RF circuitry 210 includes input matching circuitry 261, which may be similar in certain respects to the input matching module 161 shown in FIG. 1 and described above.

The RF circuitry 210 may include a port or transmission channel 211 for receiving an RF input signal, such as from a transceiver or other system component, and may further include input matching circuitry 261, as described above. In certain embodiments, the RF circuitry 210 includes input bias circuitry 231, which may serve to bias the current injected into a driver transistor of an input amplifier stage 231 (e.g., driver stage). The input amplifier stage 231 may comprise a cascode amplifier, as described herein, or may comprise a common-emitter or other type of amplifier.

The RF circuitry may further include inter-stage matching circuitry 263 disposed between the input amplifier stage 231 and a second (e.g., output) amplifier stage. Bias circuitry 253 may further be connected between the amplifier stages 231, 233. For example, the bias circuitry 253 (i.e., "bias boost") may be connected in parallel with the signal transmission path. The bias boost 253 may provide gain-compensation circuitry for the output amplifier stage 233. In certain embodiments, the bias boost 253 comprises a power detector configured to adjust the current provided to a driver transistor of the output amplifier stage 233. In certain embodiments, the bias boost 253 may be configured to provide two or more discrete gain factor values for controlling the gain of the amplifier 233.

The output amplifier stage may comprise a cascode power amplifier, or other type of amplifier. The RF signal output of the output amplifier stage 233 may be provided to output matching circuitry 262. The output matching circuitry may be configured to provide a load line designed to provide efficiency at a transmit power level at which the circuit 210 is intended to operate. In certain embodiments, the output matching circuitry may be dynamically configurable to provide two or more discrete impedance values, which may be desirable to provide optimized load line impedance for a plurality of power levels, such as low- and high-power operational levels. The amplifier output matching circuit 262 may be controllable by a control line (not shown) that adjusts the impedance between a lower impedance and a higher impedance. Although certain embodiments are disclosed herein in the context of two-mode output matching impedance, it should be understood that adjustable matching networks as disclosed herein may have any number of modes.

Figure 3A:
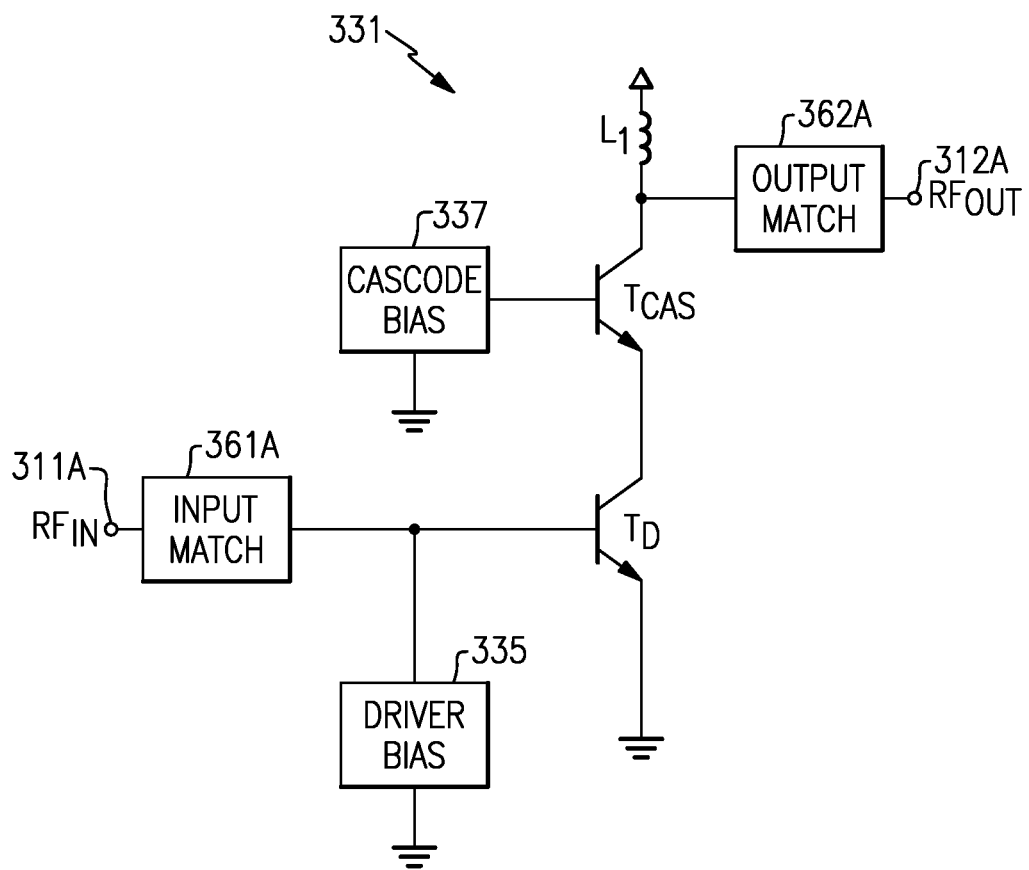
FIG. 3A is a circuit diagram illustrating a cascode power amplifier according to one or more embodiments.

FIG. 3A is a circuit diagram illustrating a single-stage cascode power amplifier according to one or more embodiments disclosed herein. The power amplifier circuit may comprise a gain stage 331 formed with the illustrated driver transistor $T_D$ and cascode amplifier $T_{CAS}$. The driver transistor $T_D$ and cascode transistor $T_{CAS}$ may comprise a plurality of sub-cells (not shown; described in greater detail below in connection with FIG. 9-11), wherein each sub-cell includes a common emitter device that controls the current through the sub-cell and a common base device that delivers the gain of the sub-cell. Certain embodiments disclosed herein provide for at least partial electrical isolation between sub-cells of the amplifier, which may advantageously protect against current redistribution that would otherwise cause current hogging and/or overheating in a sub-group of the sub-cells of the amplifier.

The circuit of FIG. 3A may include driver bias circuitry 335 coupled to the base of the driver transistor $T_D$. The driver bias circuit 335 may include power detection circuitry, which may set the current through the amplifier transistor(s), such as through the use of a current mirror. In certain embodiments, a resistor (not shown) may be placed in series with the driver bias circuitry 335 to provide increased control over the gain curve. In certain embodiments, the resistance coupling the driver bias 335 to the driver transistor $T_D$ is adjustable using a switch or the like. For example, a first resistance may be utilized when the output power is high, while a second resistance may be utilized when the output power is low.

It may be desirable for the base of the cascode transistor $T_{CAS}$ to be substantially free of RF signal, such that a substantially fixed DC voltage is present at the base of the device. In certain embodiments, the amplifier 331 may include cascode biasing circuitry 337, such as a DC voltage source, or the like, connected between the base of the cascode transistor $T_{CAS}$ and ground to provide DC voltage to the base of the cascode transistor $T_{CAS}$. In certain embodiments, a capacitor (not shown), or some type of capacitance, may be connected between the base and emitter (or collector) of the cascode transistor $T_{CAS}$. For example, the cascode transistor $T_{CAS}$ may be subject to AM-PM distortion due to voltage swing volatility. Therefore, in certain embodiments, a linearizing capacitor (not shown) may be placed in parallel with the base-emitter capacitance of the cascode transistor $T_{CAS}$. Such capacitor placement may allow for modification of the shape of the AM-PM curve by selecting an optimized size for the capacitor.

The amplifier circuit of FIG. 3A further includes output matching circuitry 362A. In certain embodiments, the output matching circuitry 362A may provide an adjustable load line, which may improve efficiency of the amplifier in backed-off power conditions, for example.

Figure 3B:
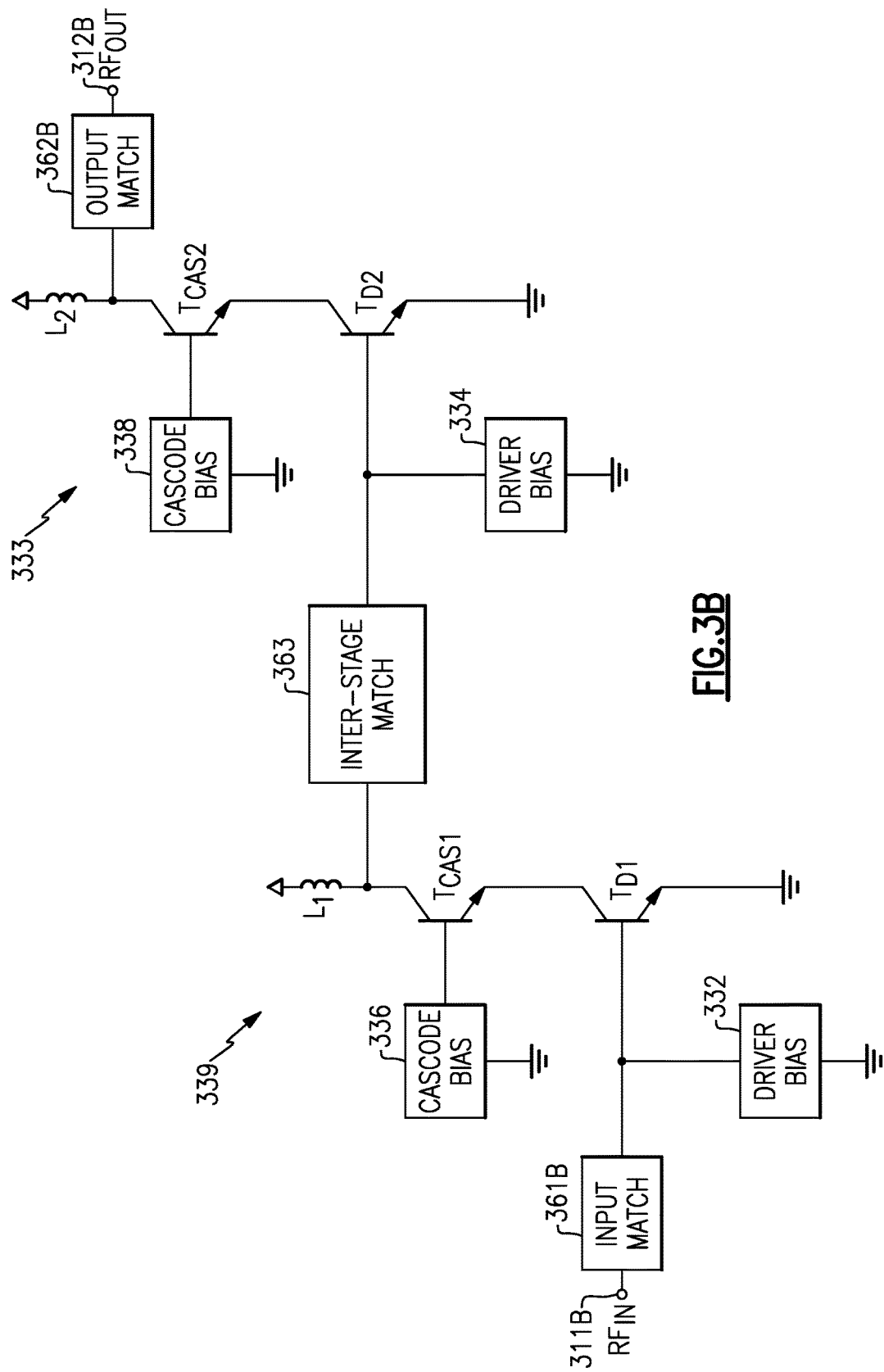
FIG. 3B is a circuit diagram illustrating a multi-stage cascode power amplifier according to one or more embodiments.

It should be understood that the principles disclosed herein may be applicable to single- or multi-stage cascode power amplifiers. FIG. 3B is a circuit diagram illustrating a multi-stage cascode power amplifier according to one or more embodiments disclosed herein. The power amplifier circuit may comprise two (or more) gain stages (339, 333), wherein the first stage is formed with the illustrated driver transistor $T_{D1}$ and cascode amplifier $T_{CAS1}$, and the second stage is formed with the driver transistor $T_{D2}$ and cascode transistor $T_{CAS2}$. The transistors of one or more of the amplifier stages 339, 333 may comprise a plurality of sub-cells (not shown; described in greater detail below in connection with FIG. 9-11), wherein each sub-cell includes a common emitter device that controls the current through the sub-cell and a common base device that delivers the gain of the sub-cell. Certain embodiments disclosed herein provide for at least partial electrical isolation between sub-cells of the amplifier, which may advantageously protect against current redistribution that would otherwise cause current hogging and/or overheating in a sub-group of the sub-cells of the amplifier.

The circuit of FIG. 3B may include driver bias circuitry (e.g., 332, 334) coupled to the base of the driver transistor of one or more of the amplifier stages 339, 333. The driver bias circuit(s) (332, 334) may include power detection circuitry, which may set the current through the amplifier transistor(s) in the associated amplifier stage, such as through the use of a current mirror. In certain embodiments, a resistor (not shown) may be placed in series with the driver bias circuitry (332, 334) to provide increased control over the gain curve. In certain embodiments, the resistance coupling the driver bias to the driver transistor is adjustable using a switch or the like. For example, a first resistance may be utilized when the output power is high, while a second resistance may be utilized when the output power is low.

It may be desirable for the base of the cascode transistor(s) ($T_{CAS1}$, $T_{CAS2}$) to be substantially free of RF signal, such that a substantially fixed DC voltage is present at the base of the device. In certain embodiments, one or more of the amplifier stages 339, 333 may include cascode biasing circuitry (336, 338), such as a DC voltage source, or the like, connected between the base of the cascode transistor and ground to provide DC voltage to the base of the cascode transistor. In certain embodiments, a capacitor (not shown), or some type of capacitance, may be connected between the base and emitter (or collector) of the cascode transistor of one or more of the amplifier stages of the circuit of FIG. 3B. For example, in cascode transistor topologies, the cascode transistor (e.g., $T_{CAS1}$, $T_{CAS2}$) may be subject to AM-PM distortion due to voltage swing volatility. Therefore, in certain embodiments, a linearizing capacitor (not shown) may be placed in parallel with the base-emitter capacitance of the cascode transistor of one or more stages of the power amplifier circuit 361B. Such capacitor placement may allow for modification of the shape of the AM-PM curve by selecting an optimized size for the capacitor. The amplifier circuit of FIG. 3B further includes output matching circuitry 362B that may provide an adjustable load line, which may improve efficiency of the amplifier in backed-off power conditions, for example.

Figure 4:
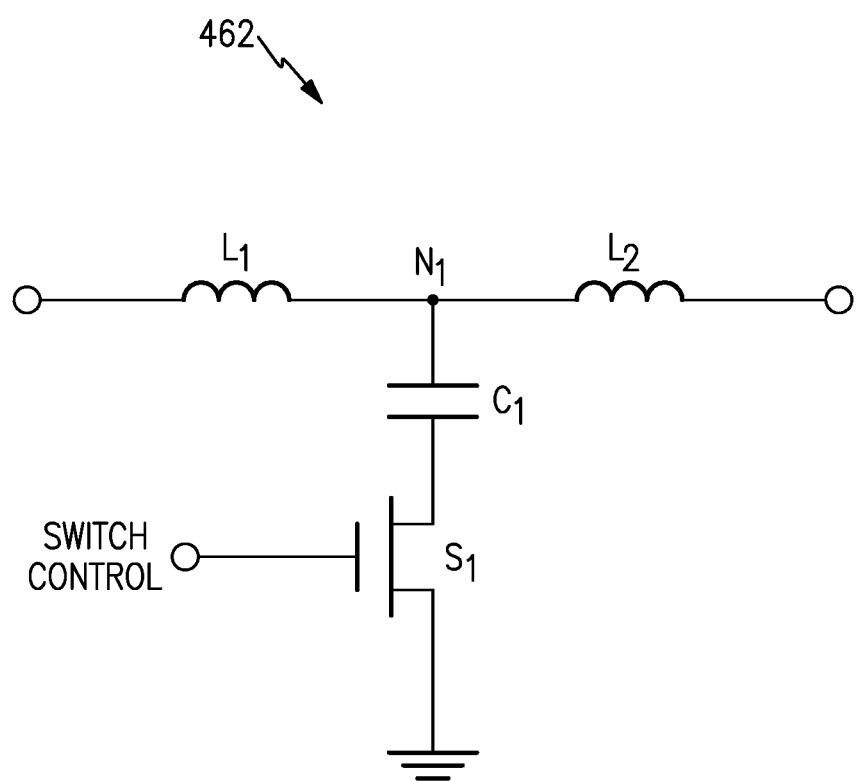
FIG. 4 is a circuit diagram illustrating an adjustable impedance output matching circuit for a power amplifier according to one or more embodiments.

FIG. 4 is a circuit diagram illustrating an embodiment of an adjustable impedance output matching circuit 462 for a power amplifier according to one or more embodiments disclosed herein. For example, the output matching circuit 362B shown in FIG. 3B and described above may be similar in certain respects to the circuit 462 shown in FIG. 4. In certain embodiments, it may be desirable for a relatively small resistance to be present at the collector of the cascode transistor of a cascode power amplifier (or driver transistor of a common-emitter power amplifier) for relatively high-power applications. However, as power is backed-off, relatively larger resistance may be desirable; with a constant load resistance, as power is backed-off, efficiency may be lost. Therefore, in order to provide flexibility in output impedance, the output matching circuit 462 may include a mechanism for adjusting the impedance of the circuit. For example, an output matching circuit 462 according to the present disclosure may include one or more switches $S_1$, which, in combination with a capacitor $C_1$ (or other passive element), may provide a relatively low impedance (e.g., about 9-10 ohms) with the switch $S_1$ in an OFF state for relatively high-power states, or alternatively a relatively high impedance (e.g., about 30-35 ohms) with the switch $S_1$ in an ON state for relatively low-power states. In certain embodiments, operation of the switch $S_1$ may provide desirable efficiency for a power level that is as low as ¼ the power of the maximum transmit level, or lower.

The output matching circuit 462 may include one or more inductors ($L_1$, $L_2$), as well as the shunt capacitor $C_1$. The shunt capacitance may be seen at the load when the switch $S_2$ is closed, thereby providing an impedance transformation down to a lower value; when the switch is open, the capacitance may be effectively removed, causing the impedance to remain at a relatively high level across the inductance.

Figure 5:
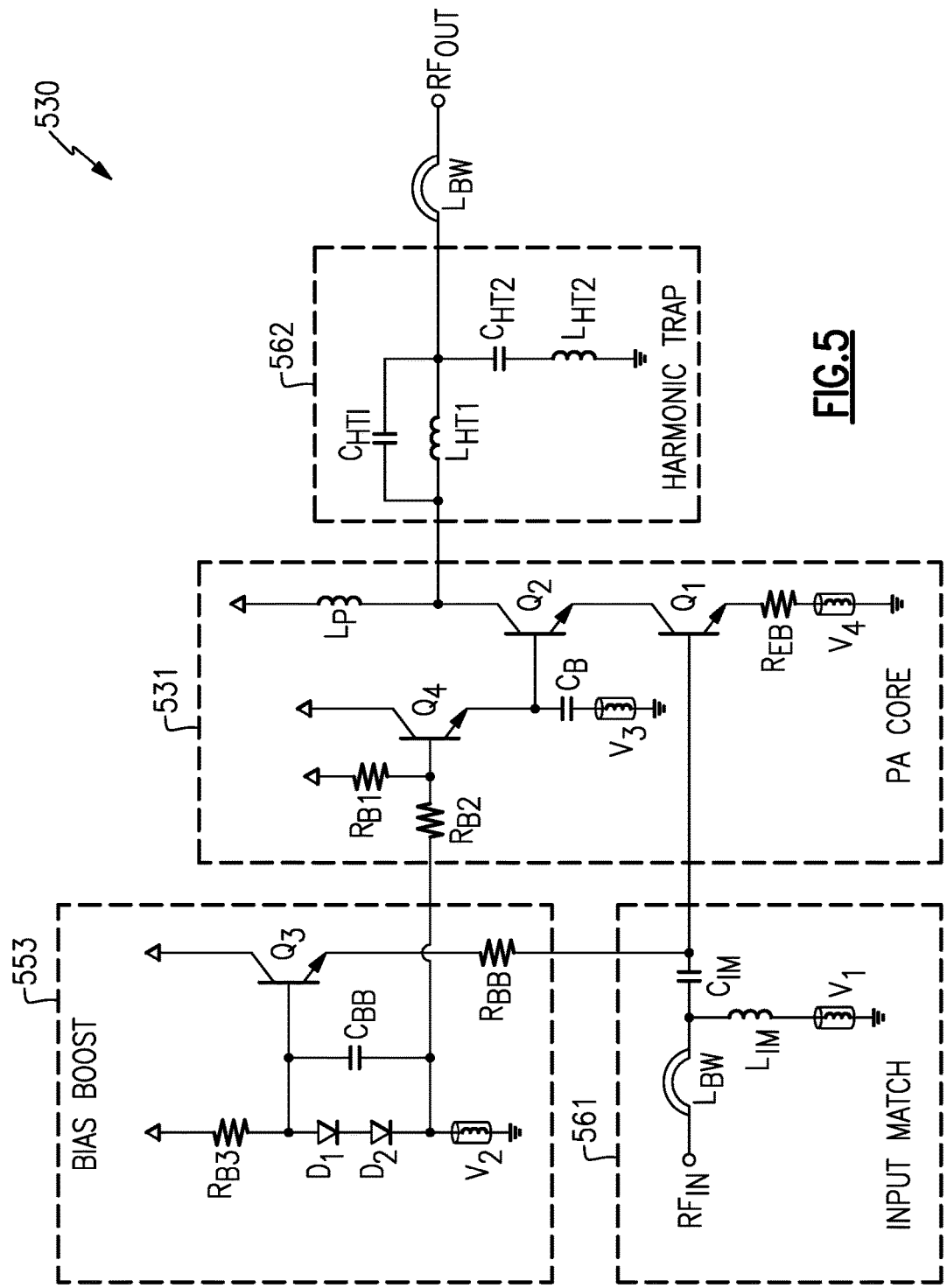
FIG. 5 illustrates a single-stage cascode power amplifier circuit according to one or more embodiments.

FIG. 5 illustrates a single-stage cascode power amplifier circuit 530 according to one or more embodiments. For example, the power amplifier 530 may represent a 2.5 GHz power amplifier circuit. The circuit 530 includes a power amplifier core 531 including a driver transistor $Q_1$ and a cascode transistor $Q_2$. The amplifier core 531 may be biased with a bias boost network 553. The bias boost network 553 may be designed to sense the input power level and adjust the base current in order to maintain the gain at a relatively consistent level in the presence of changing input power levels and to provide improved efficiency.

The power amplifier core 531 may include an emitter follower transistor $Q_4$ that may be used to bias the base of the common-base cascode transistor $Q_2$. In certain embodiments, a tuned circuit (e.g., LC circuit) may be used as a matching network for matching the input of the amplifier to, for example, 50Ω. The circuit 530 may include one or more through-wafer ground paths or vias ($V_1$, $V_2$, $V_3$). One or more of the transistors of the circuit 530, such as the power amplifier core transistors Q1 and Q2, may comprise electrically-isolated sub-cells to reduce non-uniform thermal and electrical distribution among the sub-cells, as described in greater detail below.

The circuit 530 includes an input matching network 561, which may comprise one or more components, such as on-chip components. For example, the matching network 561 may comprise an inductor $L_{IM}$ and a capacitor $C_{IM}$ in combination with the bond wire inductance $L_{BW}$. The trace length connecting the emitter of $Q_1$ to the through wafer via $V_4$ may be optimized. Due to the size of the driver transistor $Q_1$, the real part of the resistance seen at the base of the transistor may be relatively low, which may result in impractical values for $C_{IM}$ and $L_{IM}$. In order to compensate, a small amount of trace inductance may be added into the emitter of the transistor $Q_1$ to increase the real part of the impedance at the base and lead to a realizable input matching network with only a small penalty to the gain.

In certain embodiments, the output transistor $Q_2$ has a 1 dB compression point greater than 30 dBm, which may allow linear operation for power output of 23 dBm. The transistor $Q_2$ may be sized so that at a power level of 30 dBm, the average current flow would bias it close to peak $f_T$. Such considerations may lead to an emitter area of approximately 1800 µm² for the relevant technology platform. The common-emitter device $Q_1$ may dissipate a substantially lower amount of power than the common-base device. In order to ease the input matching as well as to improve the frequency response, the transistor $Q_1$ may be sized to be approximately half the size of the common-base device $Q_2$, with an emitter area of approximately 900 µm², for example. For cascode designs, a lower output swing may be desired compared to a common-emitter design, which can result in a smaller optimum load resistance, higher average current, and/or a larger device area. Therefore, a cascode design may use more transistor area than a traditional common-emitter design for the same power level. In certain embodiments, the load line may be chosen to be 50Ω and $Q_2$ may be biased to avoid $Q_1$ entering saturation, which can cause excessive power-dependent phase shift.

Figure 6:
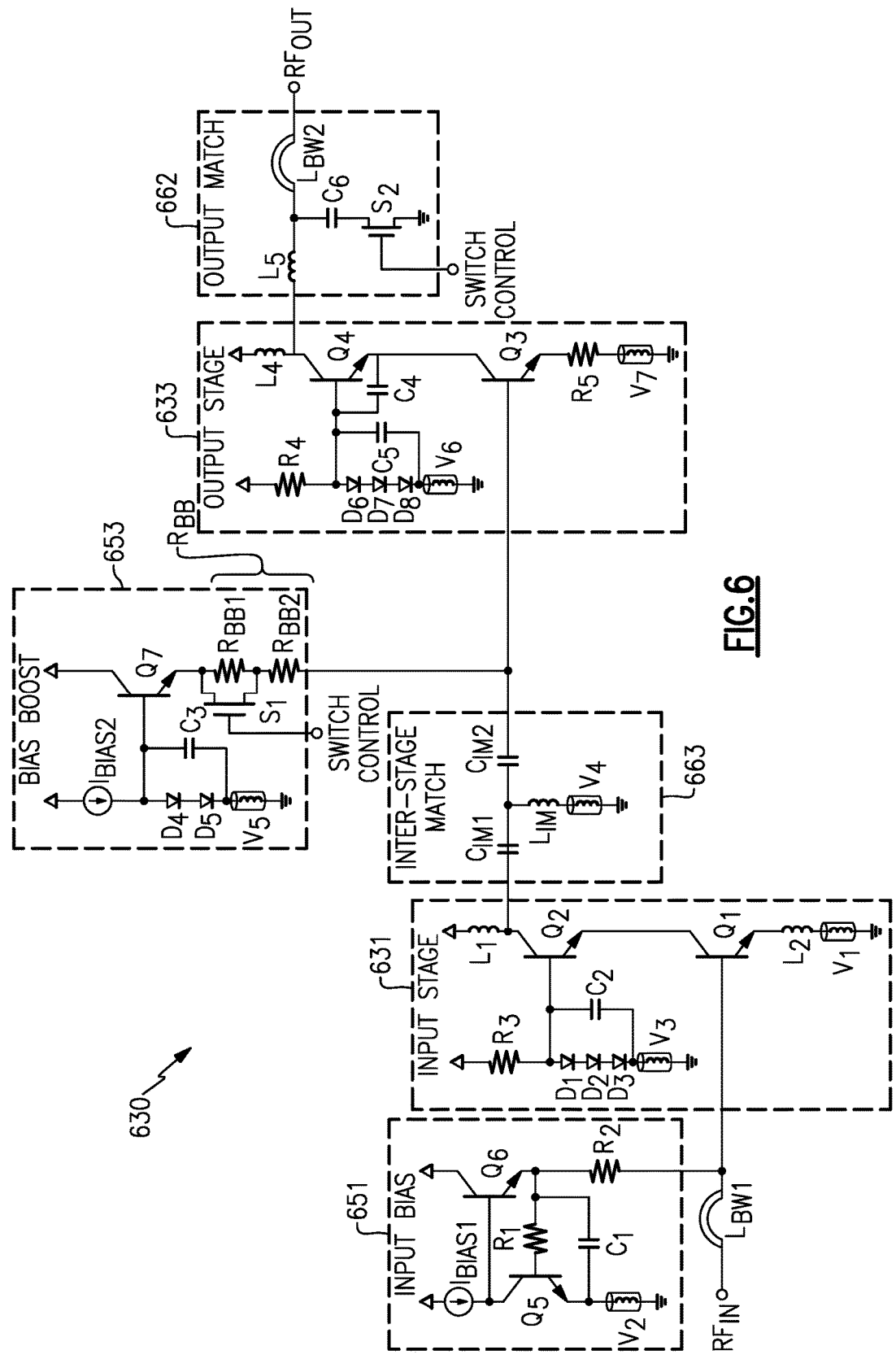
FIG. 6 is a circuit diagram illustrating a multi-stage cascode power amplifier circuit according to one or more embodiments.

FIG. 6 is a circuit diagram illustrating a multi-stage cascode power amplifier circuit 630 according to one or more embodiments. In one embodiment, the amplifier circuit 630 may represent a 5 GHz cascode power amplifier design, which may be implemented in a BiCMOS process, for example. In certain embodiments, all or a portion of the illustrated components may be formed and/or mounted in a single chip or die.

The circuit 630 may be designed with, for example, a 5 V power supply. In certain embodiments, amplifier 630 is matched to the load with the use of a switchable output matching network 662. The matching network 662 may provide both a high-power mode of operation (e.g., low-resistance load line and high bias current) and a lower-power mode of operation (e.g., high-resistance load line and low bias current) to provide relatively higher overall efficiency over a wider range of operating power levels. In one embodiment, the amplifier may be designed to with an 8 V power supply. Changing the supply voltage on only the output transistor collector may allow the matching network to be removed entirely in certain embodiments. Such an implementation may provide high-current and low-current modes of operation without a switchable load line.

The output stage 633 may be biased with a bias boost network 653, which may be designed to sense the input power level and adjust the quiescent current in order to main relatively constant gain in the presence of varying input power levels. The use of a bias boosting cell may help to flatten the gain curve of the design. In certain embodiments, the circuit 630 may be designed for WLAN applications, wherein at an EVM level of 3%, the PAE is 9.9-11.2%.

The amplifier circuit 630 may include input matching circuitry comprising a combination of inductive emitter degeneration and input bond wire inductance that provides a relatively broadband match across a bandwidth of interest (e.g., 4.9-6.0 GHz). For example, in an embodiment, a radio frequency (RF) input signal is transmitted to the circuit 630 over a metal connector that is connected between the chip associated with the circuit 630 and a printed circuit board (PCB). The metal connector may comprise two parallel bond wires connected to the package. Such connector may provide an inductance $L_{BW1}$, which may be used as part of a matching component for the input of the amplifier circuit 630. In certain alternative embodiments, matching inductance is provided by one or more discrete inductors and/or other passive devices or elements. The inductance of the wire connector $L_{BW1}$ may be approximately 500 or 600 pF, or some other value. The input matching may further be accomplished (e.g., for 5-6 GHz) using an emitter inductor $L_2$ in combination with the input bond wire $L_{BW1}$ to form a two-element broadband matching network to match the circuit to an input impedance (e.g., 60 ohms) across a target bandwidth (e.g., 1 GHz bandwidth). In certain embodiments, the emitter inductor $L_2$ may be sized according to the following equation:

$$L_2 = \frac{R_s C_{\pi 1}}{g_{m1}} \tag{1}$$

where $R_s$ is the desired matching impedance (e.g., 60 ohms). Therefore, the bondwire $L_{BW1}$ may advantageously have an inductance of:

$$L_{BW1} = \frac{1}{C_{\pi 1} \omega} - \frac{R_s C_{\pi 1}}{g_{m1}} \tag{2}$$

where ω is the desired frequency of operation.

The circuit 630 includes input bias circuitry 651, which receives input power from the RF input signal and outputs a current level into the base of the driver transistor $Q_1$. In order to prevent the bias circuitry 651 from increasing the current to the amplifier by too great an amount, the circuitry 651 may include a resistor $R_2$ configured to control the amount of input power that is seen by the bias circuit 651. In certain embodiments, $R_2$ provides an RF choke to at least partially isolate the bias circuit 651 from the RF signal. Because the resistor $R_2$ may at least partially control the amount of gain expansion in the circuit, it may be desirable for the value of $R_2$ to be chosen such that the gain of the amplifier remains substantially flat over an operational range of the amplifier. With a relatively large resistor value, a relatively constant current may flow into the amplifier; as the signal power increases, the transistor $Q_1$ may at least partially compress, causing the gain to drop. With a relatively small resistor value, as the power level increases, causing the transistor $Q_1$ to compress and become nonlinear, a higher current level may be injected into the base of the transistor $Q_1$ to effectively offset the nonlinearity caused by increased power.

The input stage 631 of the circuit 630 may include DC bias circuitry coupled to the base of the cascode transistor $Q_2$. As a nonlinear device, the base-to-emitter voltage of the transistor $Q_2$ may be sensitive to the signal power level present at the base due to, for example, second-order distortion. Therefore, in certain embodiments, the base of each cascode transistor of the circuit (e.g., $Q_2$, $Q_4$) may be AC-grounded through a relatively large capacitor, which may advantageously be connected as closely as possible to the base of the transistor. However, in certain embodiments, even relatively large capacitor values (e.g., 15 pF for $C_2$ and/or 25 pF for $C_5$) may not provide sufficient grounding at the base of the transistor(s). When the voltage swings become large, such node(s) may experience changes in the bias level. In order to reduce this effect, diodes may be utilized to provide a relatively constant bias voltage to the bases of the cascode transistors. In the illustrated circuit 630, three diodes are used ($D_1$, $D_2$ and $D_3$ for transistor $Q_2$; and $D_6$, $D_7$ and $D_8$ for transistor $Q_4$) to provide a bias voltage of, for example, about 2.4 V to the base of the cascode transistor(s). Such a configuration may result in a VCE of approximately 1.5 V for both transistor $Q_1$ and transistor $Q_3$, which may keep them out of saturation and also provide sufficient head room for the transistor $Q_2$ and the transistor $Q_4$.

The input stage 631 of the power amplifier 630 may be designed as a class-A amplifier with a peak voltage swing not to exceed 3 V, for example. An RF choke inductor $L_1$ may provide bias to the input stage 631. The load line and current for the input stage 631 may be designed to allow for the amplifier to remain linear and allow the design performance to be substantially limited by the output stage 633.

Figure 14:
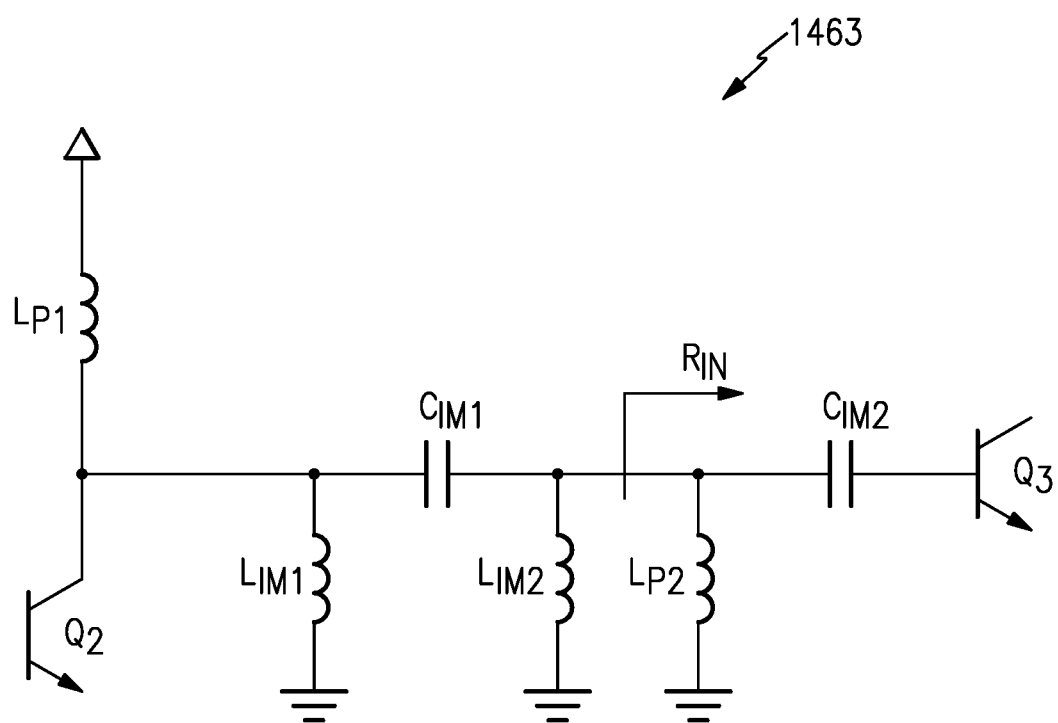
FIG. 14 illustrates a representation of an inter-stage matching circuit according to one or more embodiments.

The circuit 630 includes inter-stage matching circuitry 663 configured to connect the two active amplifier stages. The inter-stage matching circuitry 663 may be utilized to match the output impedance of the driver stage to the input of the output stage. A conceptual representation of the inter-stage matching circuitry 663 is shown in FIG. 14. As shown in FIG. 14, $L_{P2}$ and $C_{IM2}$ may form a conventional LC matching network to transform the input impedance of $Q_3$ into a real impedance. In certain embodiments, a relatively low impedance may be used to broaden the bandwidth of the match. In addition, $L_{IM}$ and $C_{IM1}$ (see FIG. 6) may form a lumped-element left-handed transmission line. The various elements of the inter-stage matching circuitry 663 may be sized so that the electrical length of the transmission line is approximately a quarter wavelength with respect to the fundamental frequency of the transmission signal. Thus, the input impedance of the output stage 633 may advantageously be transformed into a desired load line that is optimal for the input stage 631. For example, the components be sized as follows:

$$L_{IM1} = L_{IM2} = \frac{Z_o}{2\pi f_c} \text{ and} \tag{3}$$

$$C_{IM1} = \frac{1}{2\pi Z_o f_c} \tag{4}$$

where $Z_o$ represents the impedance of the transmission line, which may be sized such that:

$$Z_o = \sqrt{R_{in\_OS} R_{LL\_IS}} \tag{5}$$

where $R_{LL\_IS}$ is the desired load line impedance for the first stage, and $R_{in\_OS}$ is the input impedance for the output stage 633.

The circuit 630 may include bias boost circuitry 653 connected in parallel to the transmission path at the base of the driver transistor $Q_3$ of the output stage. The use of a bias boosting cell may help to flatten the power added efficiency (PAE) curve of the circuit 630. In a bipolar transistor with resistive degeneration, the output current may be represented by the following power series:

$$i_{c4} = \frac{v_s}{R_{EB} + r_{e3}} + \frac{1}{2I_{C4}}\left(\frac{r_{e3}}{R_{EB} + r_{e3}}\right)\left(\frac{v_s}{R_{EB} + r_{e3}}\right)^2 + \left[\frac{1}{2I_{C4}^2}\left(\frac{r_{e3}}{R_{EB} + r_{e3}}\right)^2 - \frac{1}{3I_{C4}^2}\left(\frac{r_{e3}}{R_{EB} + r_{e3}}\right)\right]\left(\frac{v_s}{R_{EB} + r_{e3}}\right)^3 \tag{6}$$

As apparent in equation (6), the third-order term of the output current power series may become negative even with a small amount of degeneration $R_{EB}$. Thus, the gain may compress at relatively high input amplitudes. Such compression may set in prior to compression at the output due to relatively large voltage swings, which may cause the transistor to enter the saturation region. With one tone applied to the system, the input voltage $v_s$ to output collector current gain may be provided by:

$$\frac{i_c}{v_s} = k_1 + \frac{3}{4}k_3 v_s^2 \tag{7}$$

which can be expanded with the use of equation (6) to give:

$$\frac{i_c}{v_s} = \frac{1}{R_E + r_e} + \frac{3}{24I_C^2}\left[3\left(\frac{r_e}{R_E + r_e}\right)^2 - 2\left(\frac{r_e}{R_E + r_e}\right)\right]\left(\frac{1}{R_E + r_e}\right)^3 v_s^2 \tag{8}$$

At low input levels, the gain may be relatively flat; however, as the input level rises, if the collector current remains substantially constant, the gain may fall off causing the amplifier to compress. In order to compensate for such effects, the bias boosting cell 653 may be designed to make $I_{C4}$ proportional to $v_s$ as well. With proper design/control, the gain curve may thereby be at least partially flattened. In order to achieve such gain linearity, the combination of the resistor(s) $R_{BB}$ and the transistor $Q_7$ may be implemented as a power detector. The power detection circuitry may be driven with $v_s$, and thus the current drawn by this branch of the circuit may be given by:

$$v_s = R_{BB}i_{c7} + v_T\left[\frac{i_{c7}}{I_{C7}} - \frac{1}{2}\left(\frac{i_{c7}}{I_{C7}}\right)^2 + \frac{1}{3}\left(\frac{i_{c7}}{I_{C7}}\right)^3\right] \tag{9}$$

It should be noted that the second-order term of equation (9) may generate a DC voltage shift in $V_{BE}$ for $Q_7$ ($V_{BE7}$) such that:

$$\Delta V_{BE7} = \frac{k_2}{2}i_{c7}^2 = -\frac{v_T}{4I_{c7}^2}i_{c7}^2 \tag{10}$$

The reduction in $V_{BE7}$ may cause $V_{BE}$ for Q3 ($V_{BE3}$) to rise by a fraction of this change controlled by the resistance $R_{BB}$:

$$\Delta V_{BE3} = \Delta V_{BE7}\left[\frac{r_{\pi3}}{r_{\pi3} + R_{BB}}\right] \tag{11}$$

Thus, as $v_s$ increases, causing the gain to compress, $I_{C4}$ may also increase, causing the gain to expand. These two effects may be designed to effectively cancel each other out. The resistance $R_{BB}$ may act to control how fast the input level increases the current in the main transistor $Q_3$. The optimum value for $R_{BB}$ may be different for different load lines, and therefore certain embodiments disclosed herein advantageously provide for switchable resistance. In certain embodiments, by activating a switch (e.g., $S_1$, controlled by a switch control signal), the value of the resistance $R_{BB}$ may be optimized for two different power levels, such as a low-power mode and a high-power mode.

In one embodiment, the second stage, or output stage, 633 of the power amplifier 630 may be designed to have a 1 dB compression point of at least, for example, 26 dBm. Such a design may allow for linear operation for an average transmit power of, for example, 19 dBm. Within the output stage 633, the transistor device $Q_3$ may be a relatively high performance BJT, while the transistor device $Q_4$ may be a relatively high power BJT designed to handle relatively large output swings and collector voltages. Both devices may be sized such that, at a power level of approximately 26 dBm, the average current flow may provide a bias close to peak $f_T$. In an embodiment, such a design may result in an emitter area of approximately 1600 μm$^2$ for one or more of the transistors $Q_3$, $Q_4$. It should be noted that a cascode design, which may have a relatively lower output swing compared to a common-emitter power amplifier, may provide a relatively smaller optimum load resistance, which may lead to relatively higher average current and/or larger device area; a cascode design may therefore require more than twice the transistor area of a typical common-emitter design for the same power level.

It may be desirable for the load line may be chosen conservatively to avoid the cascode transistor $Q_4$ entering a saturation state, which may cause undesirable power-dependent phase shift through the device. In addition, a capacitor $C_4$ may be added to place a linear capacitance in parallel with $C_{\pi 4}$ to further linearize the phase shift through the device to a higher power level. For example, the cascode transistor $Q_4$ may cause AM-PM distortion to a greater extent than the driver transistor $Q_3$ in certain embodiments in view of such voltage swings; the driver transistor $Q_3$ may see a relatively smaller voltage swing, and may therefore be more linear. Therefore, the circuit 630 includes an AM-PM distortion compensating capacitor $C_4$ between the emitter of the cascode transistor $Q_4$ and its base.

DC bias circuitry including one or more resistors (e.g., R4), diodes (e.g., diodes $D_6$, $D_7$, $D_8$, and/or capacitors (e.g., $C_5$) may be connected in parallel at the base of the cascode transistor $Q_4$. The bias circuitry may provide a DC voltage to the base of the cascode transistor $Q_4$. The capacitor $C_5$ may serve to provide a ground reference at the base of the transistor $Q_4$ with respect to RF signals, resulting in a substantially fixed DC value at the base of the transistor $Q_4$.

According to certain embodiments, the values of $C_4$, $R_2$ and/or $R_{BB}$ may be selected to provide optimal AM-PM performance. Selection of values for such devices may be based on simulation. For example, because the transistors of the circuit may handle relatively large signals, they may generally operate in a relatively nonlinear manner, and therefore simulation may be a desirable means for identifying the desired resistor and/or capacitor values.

The output matching network 662 may incorporate an LCL network to transform, for example, a 60 ohm load to the optimal load impedance (e.g., for 26 dBm at 6 V). In order to increase the efficiency when the power amplifier is operating at a lower output power, the load line may be switched using a switch $S_2$, such as an NFET device. The switched resistance may provide approximately four times the load resistance in certain embodiments, and thus increase efficiency of the design while possibly reducing the output power to, for example, 20 dBm or lower.

The switch $S_2$ may be coupled to the output path via a capacitor $C_6$. In addition, the output path may include an inductor $L_5$. In some embodiments, the capacitor $C_6$ and/or inductor $L_5$ may be omitted. Furthermore, in an embodiment, a higher power supply, such as an 8 V power supply, may be utilized. Such designs may allow the amplifier to drive 50 ohms directly without the need to adjust the load line with a matching network. With only two stages, a gain of more than 26 dB across the entire band may be achievable in certain embodiments and/or conditions.

The illustrated switchable load line technique based on control of the switch $S_2$ may provide increased power-added efficiency when the power amplifier is delivering lower output power. In one example implementation, the circuit design of FIG. 6 may implement a 6 V power supply to achieve a peak PAE of approximately 29%, and a 1 dB compression point of approximately 26.5 dBm. Therefore, the power amplifier circuit 630 may be matched to the load with the use of a switchable output matching network. The switchable output matching network may comprise one or more inductors, or inductive elements. For example, an inductance $L_{BW2}$ may be provided by an inductor formed with a bond wire in certain embodiments.

Figure 7:
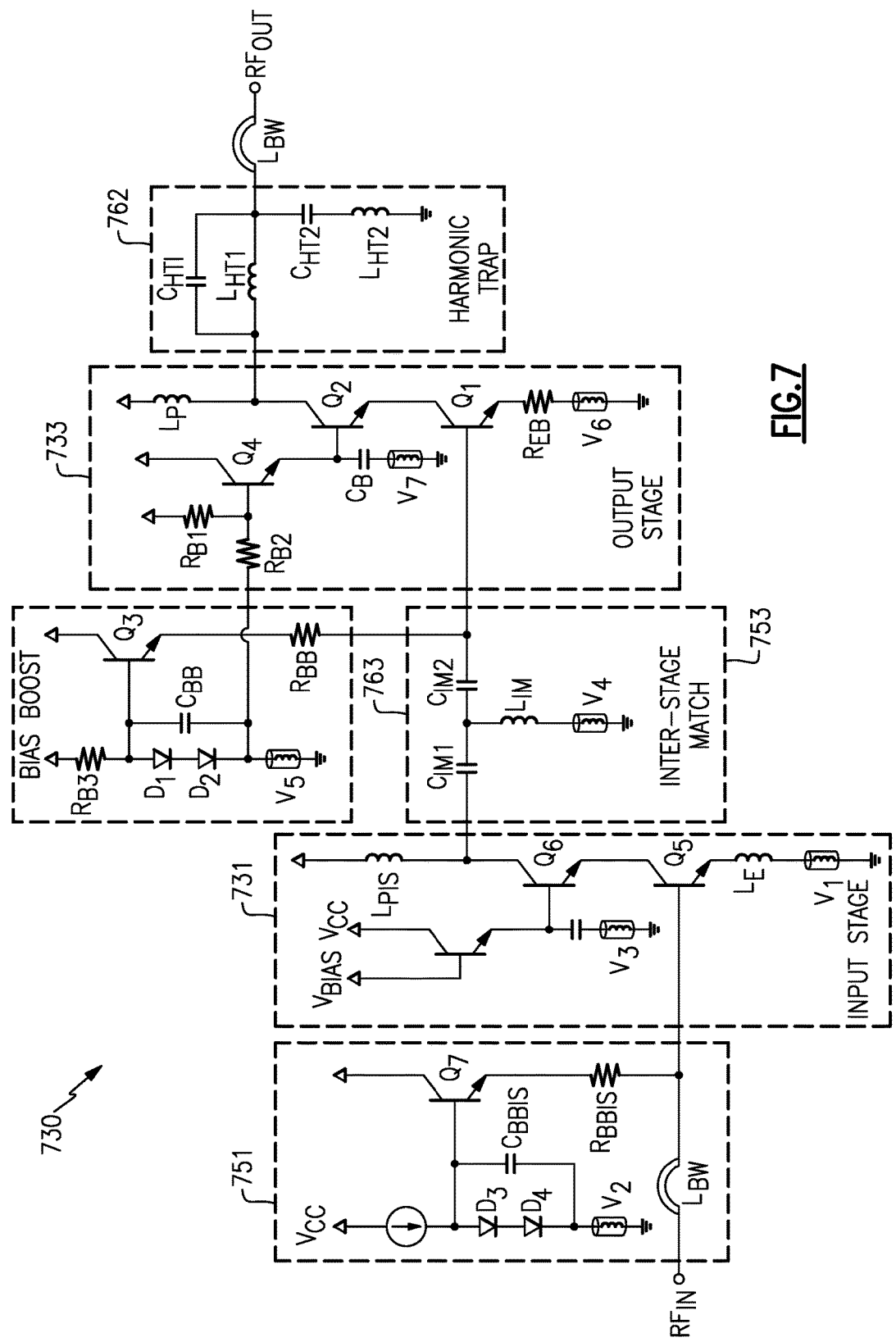
FIG. 7 is a circuit diagram illustrating a multi-stage cascode power amplifier circuit according to one or more embodiments.

FIG. 7 is a circuit diagram illustrating a multi-stage cascode power amplifier circuit 730 according to one or more embodiments. The circuit 730 may represent a 5 GHz power amplifier circuit. The circuit 730 includes both a driver/input stage 731 formed with transistors $Q_5$ and $Q_6$ as well as an output stage 733. In certain embodiments, both the input and output stages are biased with bias boost circuitry (751, 753) designed to sense the input power level and adjust the base current in order to maintain relatively constant gain over varying input power levels, as well as to provide improved efficiency. An emitter follower transistor $Q_4$ may be used to bias the base of the common base transistor $Q_2$. A combination of inductive emitter degeneration LE and input bond wire inductance $L_{BW}$ may provide a broadband match across the bandwidth of interest (e.g., 4.9-6.0 GHz). An inter-stage match 763 may also be used to match the output impedance of the input stage 731 to the input of the output stage 733.

In one embodiment, on-chip components may be utilized to implement the choke inductor and a harmonic trap 762 at the output. In an alternative embodiment, the harmonic trap 762 may be omitted, wherein a bond wire is used to implement the choke inductor and provide desirably-low loss at the output.

FIG. 7 shows an output stage 733. While it may not be necessary to utilize an output matching network for certain embodiments, shown is a basic matching network 762 that makes use of a series and parallel LC resonator, which may provide a high series and low parallel resistance at the second harmonic frequency. As an example, the resonance frequency of the two resonators may be offset slightly in an attempt to achieve satisfactory attenuation across the bands of interest. In certain embodiments, the resonator may be omitted, wherein the inductor $L_p$ as may be implemented as a bond wire, which may advantageously provide reduced output loss.

Figure 8:
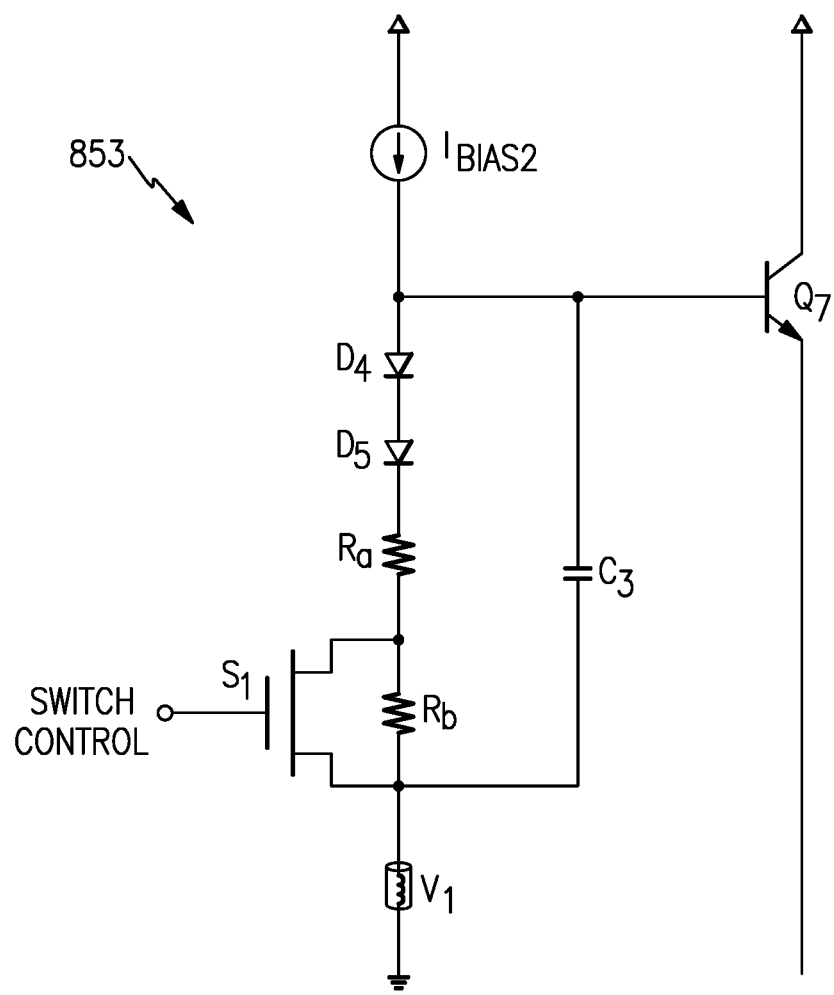
FIG. 8 is a circuit diagram illustrating a bias boost circuit according to one or more embodiments.

FIG. 8 illustrates a circuit 853 that may be used as a bias boost in any of the circuits described above in addition to, or as an alternative to, certain bias boost circuits disclosed herein in connection with the circuits described above. In certain embodiments, the current may be switched from a high-linearity/high-output mode to a low-linearity/high-efficiency mode using a switch $S_1$ (e.g., FET). In certain embodiments, the load line may be left constant. While adjusting the load line may provide a desirable solution in certain embodiments, the addition of loss in the matching network that may need to be added in order to account for the load line may negate any benefits.

Figure 9:
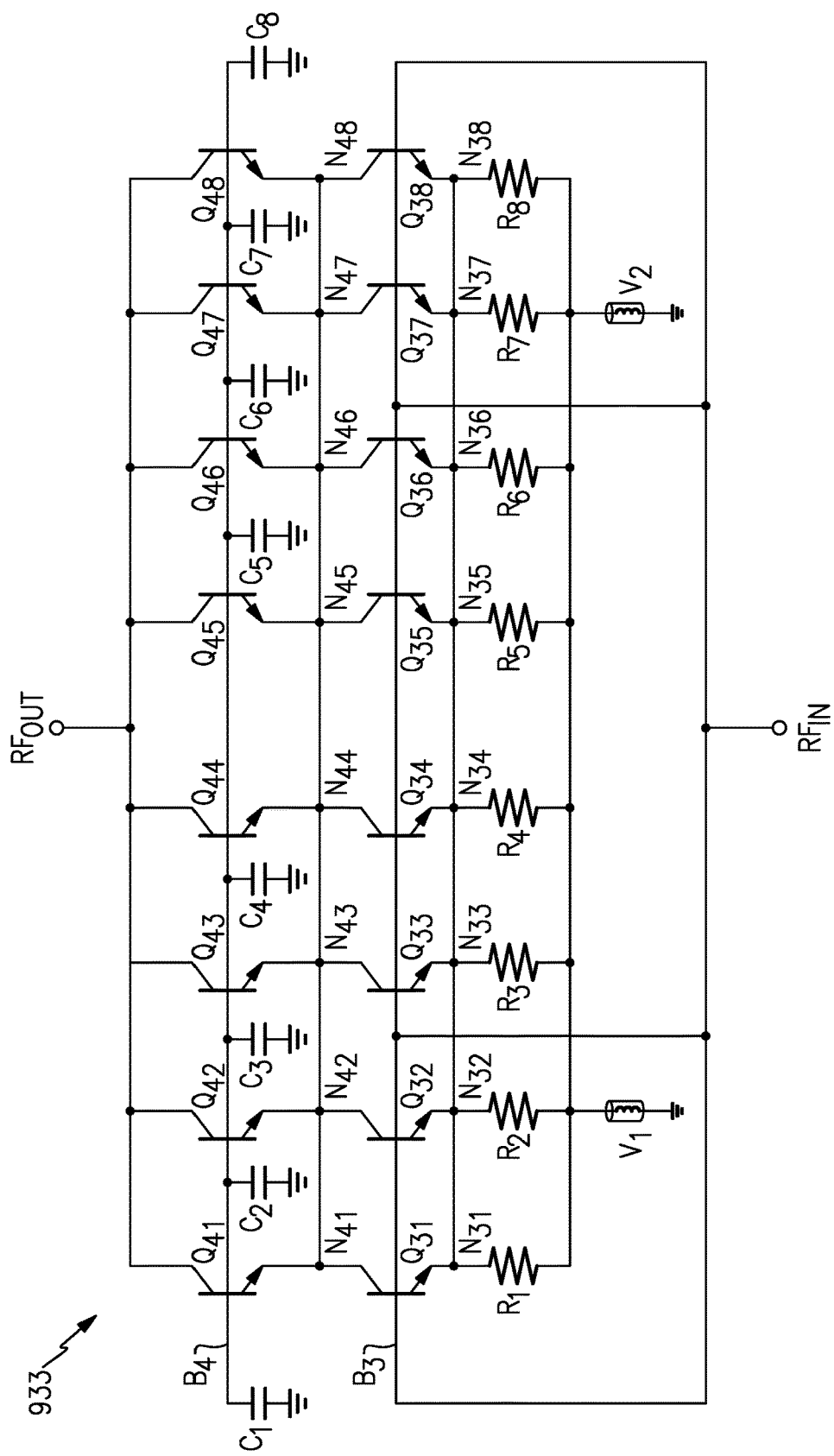
FIG. 9 is a circuit diagram illustrating an output power cell comprising sub-cells that are not electrically isolated according to one or more embodiments.

Certain of the cascade power amplifier circuits shown in the figures and described above include output power cells, which may be implemented in various ways. Certain embodiments disclosed herein are output power cells that comprise electrically-isolated sub-cells in order to prevent current redistribution among sub-cells. FIG. 9 illustrates an output power cell 933 comprising sub-cells that are not electrically isolated. The circuit 933 includes an array of transistors corresponding to each of a driver stage $Q_3$ and a cascode stage $Q_4$. That is, the transistors $Q_{31}$-$Q_{38}$ may correspond to the driver transistor(s) represented in an output stage of any of the cascode power amplifier circuits described and illustrated herein. Furthermore, the transistors $Q_{41}$-$Q_{48}$ may correspond to the cascode transistor(s) represented in an output stage of any of the cascode power amplifier circuits described and illustrated herein. One or more of the sub-cells of the circuit 933 may further include a capacitance ($C_1$-$C_8$) at the base of the cascode transistor.

Although eight transistors are shown for both the driver and cascode transistor arrays of the circuit 933, it should be understood that the circuit 933, and any output cells disclosed herein, may comprise any number of transistor cells.

In some implementations, in a power cell such as the power cell 933, the various sub-cells, each including a driver transistor $Q_{3X}$ connected at its collector to the emitter of a cascode transistor may be electrically connected at one or more sub-cell nodes. For example, the nodes $N_{41}$-$N_{48}$ connecting the emitters of the cascode transistors $Q_{41}$-$Q_{48}$ to the collectors of the driver transistors $Q_{31}$-$Q_{38}$ may be shorted together. Additionally or alternatively, the emitter nodes $N_{31}$-$N_{38}$ of the driver transistors $Q_{31}$-$Q_{38}$ may be electrically connected to each other. In an implementation, resistors $R_1$-$R_8$ are connected between the emitter nodes $N_{31}$-$N_{38}$ and ground.

The electrical connections between nodes $N_{41}$-$N_{48}$ and/or between nodes $N_{31}$-$N_{38}$ may present various disadvantages. For example, the transistor(s) toward the center of the array 933 may tend to become hotter than the transistor(s) on the outer portions of the array, wherein the relatively hotter transistors may draw relatively more current. By shorting the sub-cells together, the current through the cascade transistor (e.g., $Q_{41}$) of a sub-cell may not necessarily be the same as the current through the corresponding driver transistor (e.g., $Q_{31}$) of the sub-cell because the current may be drawn across the inter-sub-cell connection toward the hotter sub-cell(s) (e.g., central sub-cells of the array). Such hogging of current by the centrally-positioned transistors may lead to uncontrolled gain and current. In view of such effects associated with shorting across sub-cells of a power cell, it may be desirable to implement a mechanism to promote uniform currents through individual sub-cells and/or across the array of sub-cells of a power cell.

Certain embodiments of output power cells in accordance with the principles of the present disclosure may comprise a set of ten cells. In each cell, the collector of the common-emitter device (e.g., driver transistor) may be connected to the emitter of the common-base device (e.g., cascode transistor). However, in certain embodiments, advantageously no connection is made at this node between cells, providing electrical isolation between sub-cells as described in detail below. Cascode topologies may be considered to provide an advantage in allowing the common-emitter transistor, which may dissipate a relatively-low power (and therefore operate at a relatively-cool temperature), to control the current flow through the common-base transistor. Therefore, providing independent connections at the connection point between driver and cascode transistors can help to prevent current hogging by the devices in the middle of an array which may be hotter than ones near the edge in certain embodiments.

Figure 10:
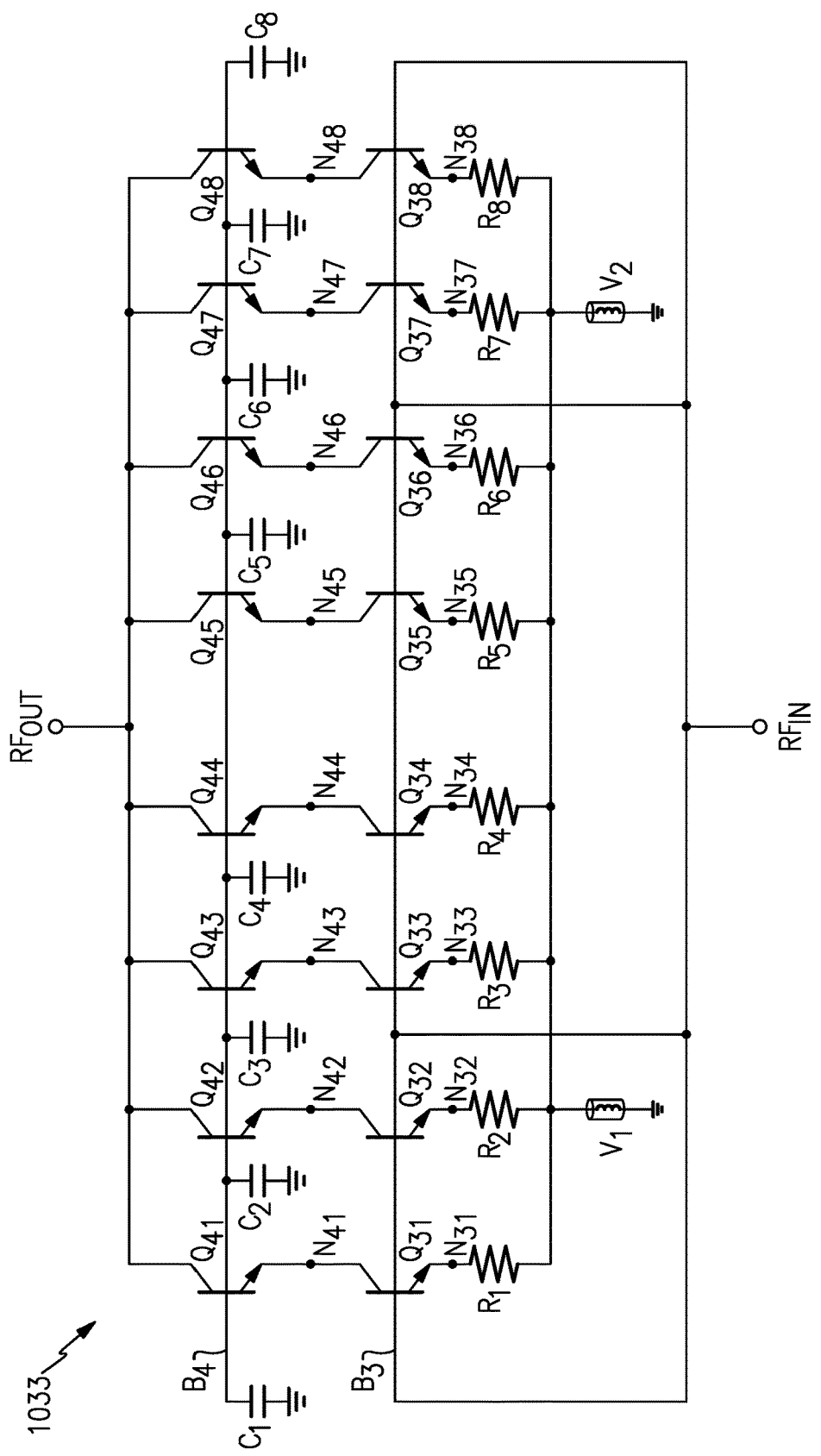
FIG. 10 is a circuit diagram illustrating a power cell implementing electrical isolation between sub-cells according to one or more embodiments.

FIG. 10 illustrates a power cell 1033 implementing electrical isolation between sub-cells in order to promote uniform current flow through driver and cascode transistors of individual sub-cells and/or across driver and/or cascode transistor arrays. The terms "electrical isolation" and "electrically isolated" are used herein in certain contexts to mean the absence of a direct electrical connection. For example, although the illustrated sub-cells in FIG. 10 are shown to be electrically connected at the collectors of the common-base devices $Q_{4X}$ and at one end of the resistors $R_x$, the sub-cells may be considered to be electrically isolated at the nodes $N_{4X}$ and $N_{3X}$ because no direct electrical connection exists connecting such nodes across sub-cells. The output circuit 1033 is illustrated as a set of eight sub-cells. However, it should be understood that the principles and features disclosed herein may be applicable to and/or implemented in power cells comprising any number of sub-cells. As described above, it may be desirable to reduce or prevent current hogging by one or more devices of the cell 1033. For example, with respect to the particular configuration of FIG. 10, it may be desirable to prevent or reduce the tendency of transistors $Q_{44}$ and $Q_{45}$ to draw more current than $Q_{41}$ and $Q_{48}$, regardless of whether transistors $Q_{44}$, $Q_{45}$ are operating at relatively higher temperatures.

In one or more of, or in each of, the sub-cell, the collector of the common-emitter driver device may be connected to the emitter of the common-base cascode device at the respective nodes $N_{41}$-$N_{48}$. However, advantageously no electrical connection may be made between the nodes $N_{41}$-$N_{48}$ of the sub-cells. In addition, in one or more of, or in each of, the sub-cells, the emitter of the common emitter driver device may be connected at the respective nodes $N_{31}$-$N_{38}$ to a respective resistor $R_1$-$R_8$, which may be connected to ground directly or via one or more additional components or features, such as a through-silicon via ($V_1$, $V_2$). However, advantageously no electrical connection may be made between the nodes $N_{31}$-$N_{38}$ of the sub-cells.

Various benefits may be provided due to aspects of the electrical isolation present in the power cell 1033 and described herein. For example, inter-sub-cell electrical isolation may allow the common-emitter driver transistor, which may generally dissipate a relatively low power and may therefore operate at a relatively low temperature, to control the current flow through the transistor. Therefore, providing electrically independent sub-cell connections may help to prevent or reduce current hogging by the devices in the middle region of the sub-cell array, which may be hotter than devices/sub-cells positioned near the edge(s) of the array. In certain embodiments, each sub-cell may have a proportional capacitance ($C_1$-$C_8$).

In certain embodiments, the driver transistors $Q_{3X}$ of the power cell 1033 may at least partially set the current flow through the circuit, such that the driver transistors may at least partially control how much current the various devices of the circuit 1033 draw. The driver transistors $Q_{3X}$ may run relatively cooler than the cascode transistors $Q_{4X}$. For example, because the upper transistors $Q_{4X}$ generate a greater amount of power and see a relatively large voltage swing at the RF output node. In certain embodiments, the voltage at the emitters of the upper transistors $Q_{4X}$ is approximately 5-7 volts, whereas, in certain embodiments, the collector voltage at the collectors of the lower transistors $Q_{3X}$ is approximately 1-2 volts, and therefore the power dissipation in such devices is relatively low and the devices run relatively cool. Therefore, the lower transistors Q3X may be more thermally stable than the upper transistors $Q_{4X}$, and advantageously control the current through the hotter devices $Q_{4X}$.

The lower transistors $Q_{3X}$ may all have substantially the same base voltage applied at the common line $B_3$, and may all draw substantially the same amount of current when operating at a uniform temperature. As described above, it may be desirable to avoid the interior cascode transistors (e.g., $Q_{44}$, $Q_{45}$) from supplying the bulk of the current to the lower transistors $Q_{3X}$ in order to avoid thermal runaway and/or thermal breakdown, which can lead to the power cell 1033 becoming unoperable.

Figure 11:
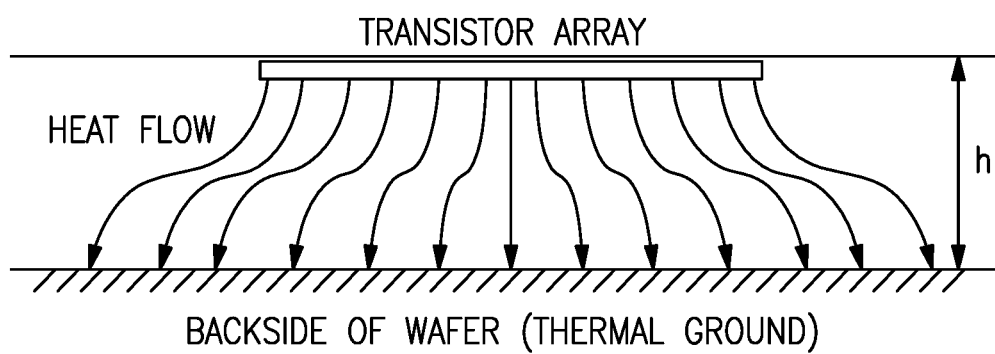
FIG. 11 illustrates a side view of a transistor array showing non-uniform thermal flow out of a power transistor according to one or more embodiments.

The particular temperature/current concerns discussed herein, and for which the proposed solutions presented herein advantageously provide certain improved performance and other characteristics, may be particularly associated with cascode amplifier topologies, as non-cascode topologies generally would not experience certain of the drawbacks of non-isolated power cells as described above. With the cascode design of FIG. 10, it is possible to implement a relatively cool array of transistors (e.g., $Q_{3X}$) for controlling the gain and current in the cell 1033 that is separated from the array (e.g., $Q_{4X}$) that primarily develops the power for the cell 1033. Conversely, with non-cascode designs, generally, it would be required to control the gain and current and develop the output power in the same device/array. With electrical isolation between sub-cells, the embodiments disclosed herein allow for ensuring against thermal runaway and/or current hogging in one part of the output array relative to another. FIG. 11 illustrates a side view of a transistor array showing example non-uniform thermal flow out of a power transistor. As described above, the design of cascode power amplifier transistors can be complicated by thermal considerations. Furthermore, it may be appreciated that gallium arsenide (GaAs) has a relatively high thermal resistivity ($\tau_{rGaAs}$=1.82·10$^{-2}$ m° C./W), and consequently devices fabricated using GaAS may run substantially hotter than ambient temperature. Since gain and DC current consumption can vary with transistor temperature, power transistor design may advantageously take these effects into account. As shown in FIG. 11, the power dissipated by the transistor array generally travels through the substrate having a thickness dimension h to the backside of the wafer, which may serve as a thermal ground. The effective thermal resistance of the power transistor can therefore be estimated as:

$$R_{PT} = \frac{\tau_{rGaAs} \cdot h}{A_{eff}} \quad (16)$$

where $A_{eff}$ is the effective cross sectional area through which the heat is passing which will be larger than the surface area of the transistor itself due to spreading. Therefore the average temperature rise in the transistor may be represented as:

$$\Delta T = R_{PT} P_{DC} \quad (17)$$

Therefore, as the area of the power transistor is increased for the same RF power density, the temperature of the cells may decrease. In addition, in the context of a cascode design, the transistor may advantageously be designed so that the common-emitter device that controls the gain remains relatively cool, while the common-base device, which delivers the output signal, gets hot. Thus, the gain and current controlling device may remain relatively stable even while the common-base device heats up or cools off as the output power that is being delivered changes.

Figure 12A:
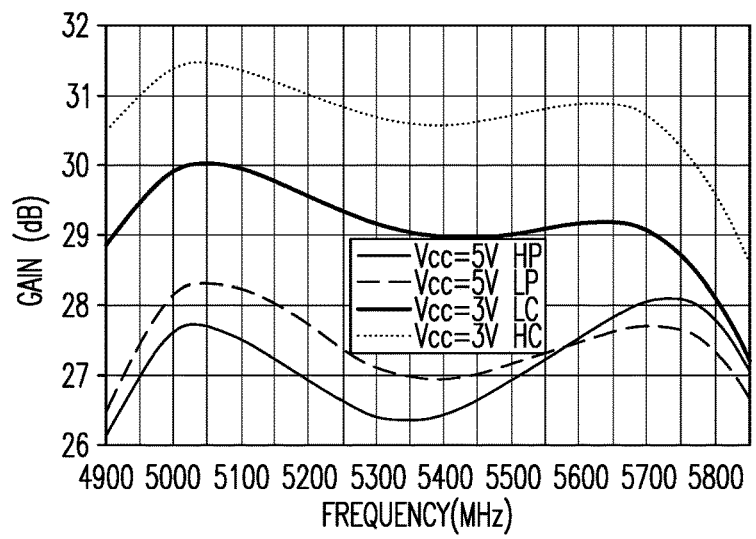
FIG. 12A is a graph illustrating potential gain performance relating to small-signal gain for a power amplifier circuit according to one or more embodiments.

FIG. 12A is a graph illustrating potential gain performance relating to small-signal gain for a power amplifier circuit according to one or more embodiments disclosed herein. Example small-signal gain for one or more circuits disclosed herein is shown for both the low power/current and high power/current modes for different variants of circuit designs disclosed herein. It can be noted that the bias current for certain circuit designs disclosed herein may be reduced in a low power mode, while the gain of the circuit may be roughly equalized. The gain may vary by approximately 2 dB between 4900 MHz and 5850 MHz in some embodiments. FIG. 12A demonstrates that for certain embodiments, gain may be relatively flat across the entire band of interest.

Figure 12B:
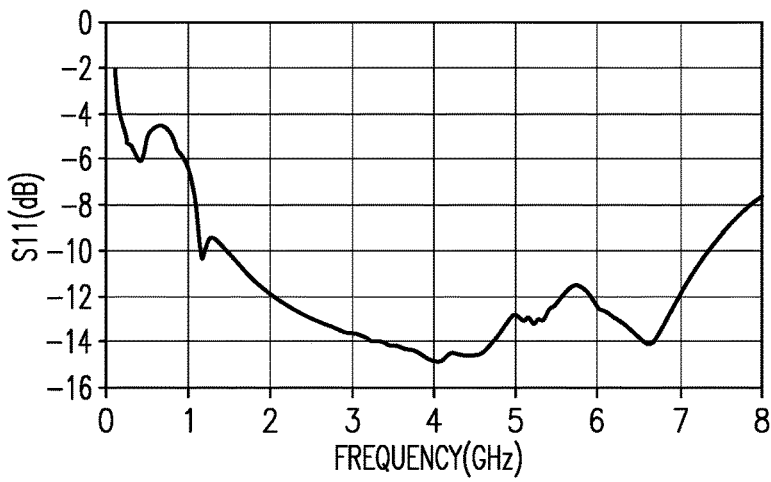
FIG. 12B is a graph illustrating small-signal input matching for power amplifier circuits according to one or more embodiments.

FIG. 12B is a graph illustrating small-signal input matching for power amplifier circuits according to one or more embodiments. The graph shows that certain circuits disclosed herein may be relatively well matched across the entire 5-6 GHz band at the input, with $S_{11}$ remaining well below −10 dB.

Figure 12C:
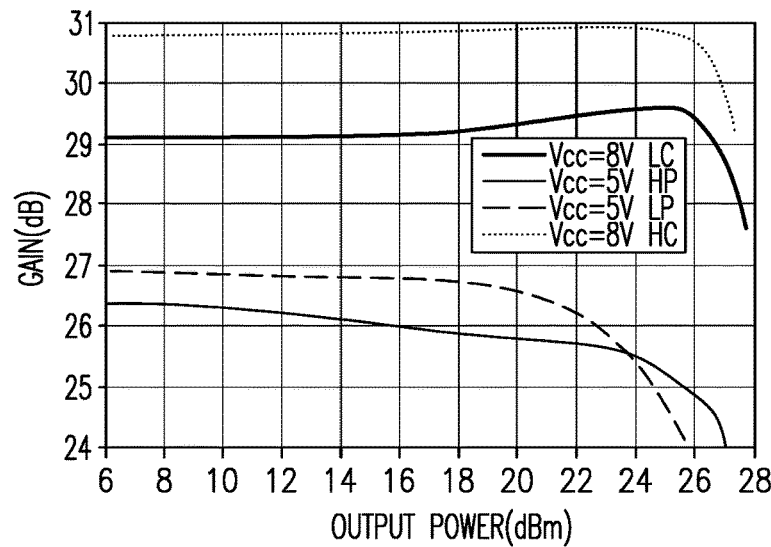
FIG. 12C is a graph illustrating gain versus output power for power amplifier circuits according to one or more embodiments.

FIG. 12C is a graph illustrating gain versus output power for power amplifier circuits according to one or more embodiments. The gain versus output power shown demonstrates that as output power level increases, gain may remain relatively constant in certain embodiments.

Figure 13A:
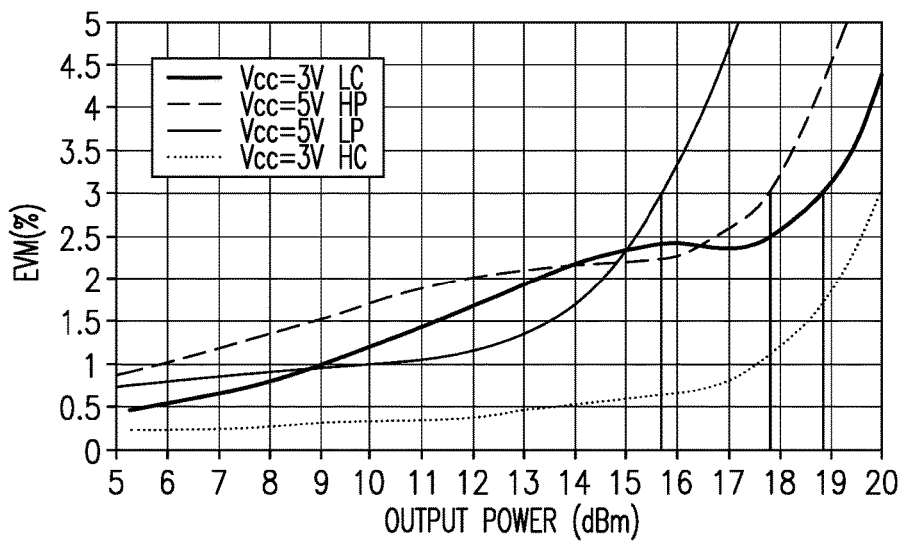
FIG. 13A is a graph illustrating EVM performance of power amplifier circuits according to one or more embodiments.

FIG. 13A is a graph illustrating EVM performance of power amplifier circuits according to one or more embodiments.

Figure 13B:
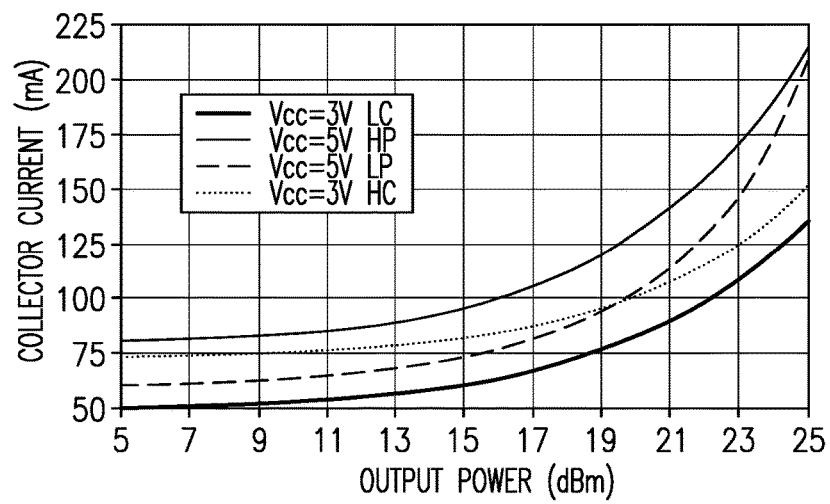
FIG. 13B is a graph illustrating output state collector current versus output power for power amplifier circuits according to one or more embodiments disclosed herein.

FIG. 13B is a graph illustrating output state collector current versus output power for power amplifier circuits according to one or more embodiments disclosed herein. The graph of FIG. 13B shows that the effect of bias boosting according to certain embodiments disclosed herein may be to increase current to the output stage as the output power becomes higher.

Figure 13C:
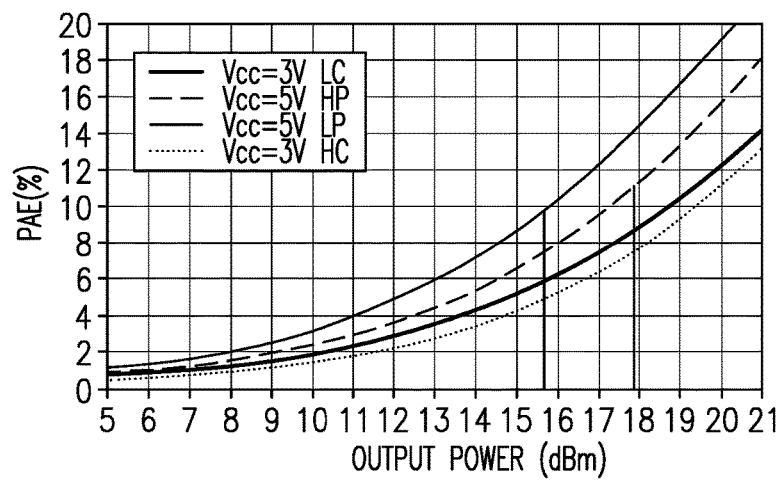
FIG. 13C is a graph illustrating power added efficiency for power amplifier circuits according to one or more embodiments.

FIG. 13C is a graph illustrating power added efficiency power amplifier circuits according to one or more embodiments. The EVM power may be between 9.8% and 11.2% for certain designs. In certain embodiments, using a low-power mode at powers below 15.6 dBm may result in up to a 2.5% increase in power added efficiency (PAE) for a 5 V design. Where the load line is not adjusted, in certain embodiments, an 8 V design may provide an improvement (e.g., at least 1%) in PAE by simply adjusting the output current.

Figure 15A:
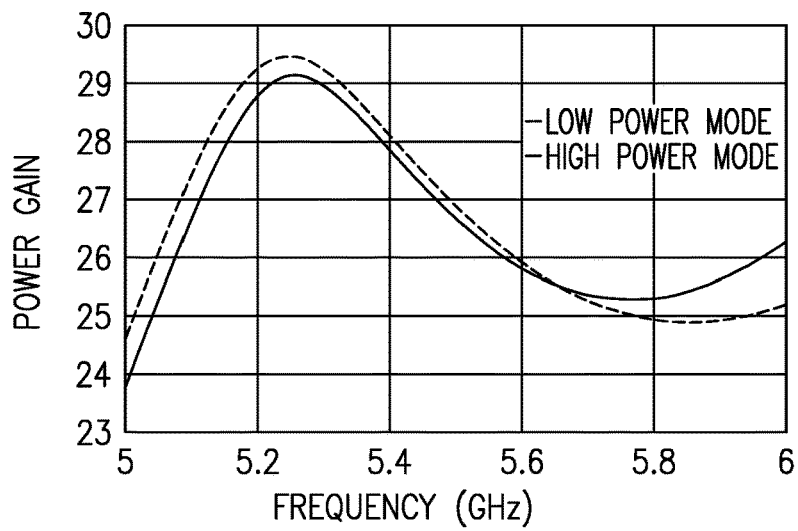
FIG. 15A is a graph representing example small-signal gain of a power amplifier implementing switchable output matching impedance in accordance with one or more embodiments.

FIG. 15A is a graph representing example small-signal gain of a power amplifier implementing switchable output matching impedance in accordance with one or more embodiments disclosed herein. The small-signal gain of a circuit is shown in FIG. 15A for both a low-power mode and a high-power mode of the associated power amplifier circuit. As shown, in certain embodiments, the bias current for the power amplifier may be at least partially reduced in the low-power mode, and may result in roughly equalized gain.

Figure 15B:
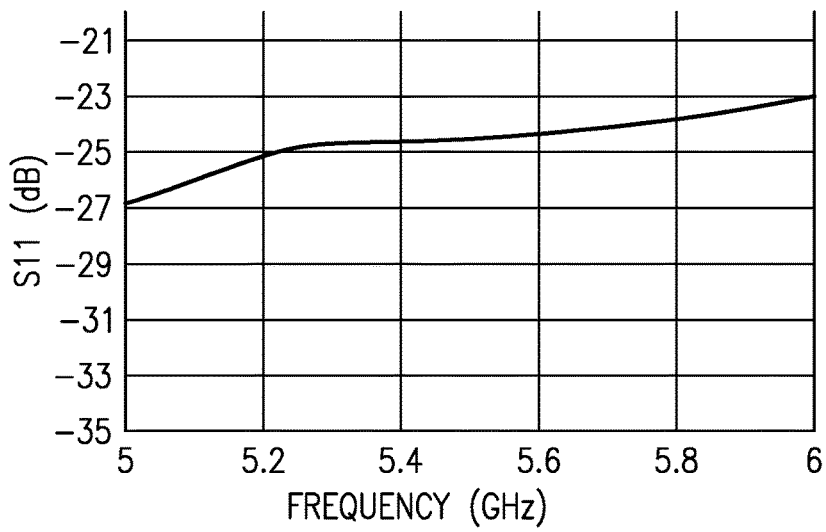
FIG. 15B is a graph representing small-signal input matching for a power amplifier implementing switchable output matching in accordance with one or more embodiments.

FIG. 15B is a graph representing small-signal input matching for a power amplifier implementing switchable output matching in accordance with one or more embodiments disclosed herein. FIG. 15B shows that, in certain embodiments, a power amplifier having switchable output matching may be designed such that it is substantially well matched across the entire 5-6 GHz band.

Figure 15C:
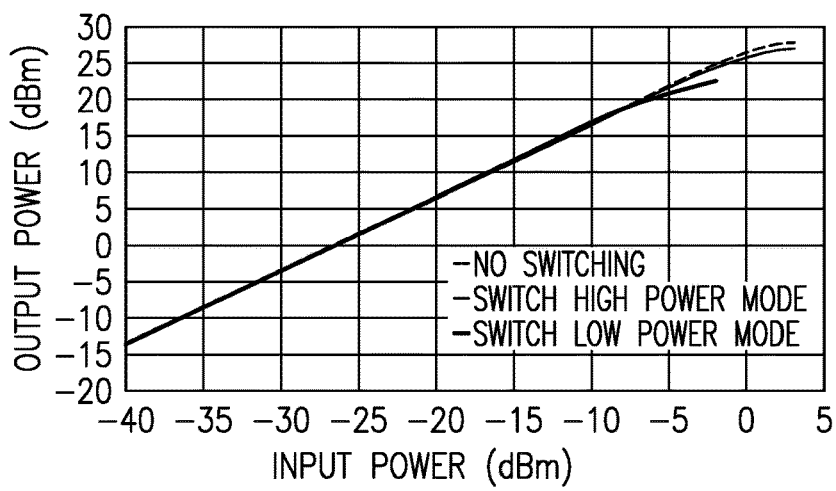
FIG. 15C is a graph showing possible input/output power characteristics of a power amplifier circuit implementing switchable output matching in accordance with one or more embodiments.

FIG. 15C is a graph showing possible input/output power characteristics of a power amplifier circuit implementing switchable output matching in accordance with one or more embodiments disclosed herein. The graph of FIG. 15C includes a curve representing potential performance characteristics for a power amplifier not implementing load line switching as disclosed herein for comparison purposes. In a high-power mode, the 1 dB compression point for the circuit may be approximately 26.5 dBm, while in a low-power mode the 1 dB compression point may be approximately 21.5 dBm.

Figure 15D:
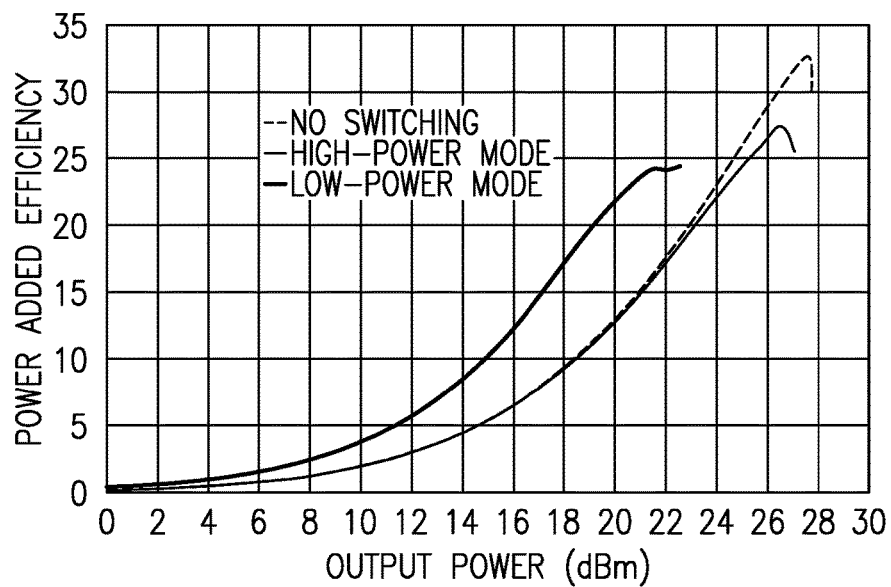
FIG. 15D represents power added efficiency (PAE) for low-power and high-power modes for a power amplifier circuit implementing switchable output matching in accordance with one or more embodiments.

FIG. 15D represents power added efficiency (PAE) for low-power and high-power modes for a power amplifier circuit implementing switchable output matching in accordance with one or more embodiments disclosed herein. FIG. 15D includes a curve representing potential PAE characteristics for a power amplifier not implementing output match switching for comparison purposes. As illustrated in the graph, while the low-power mode may not reach the same peak PAE value as the high-power mode, the low-power mode may provide relatively improved PAE at backed-off power levels.

Figure 15E:
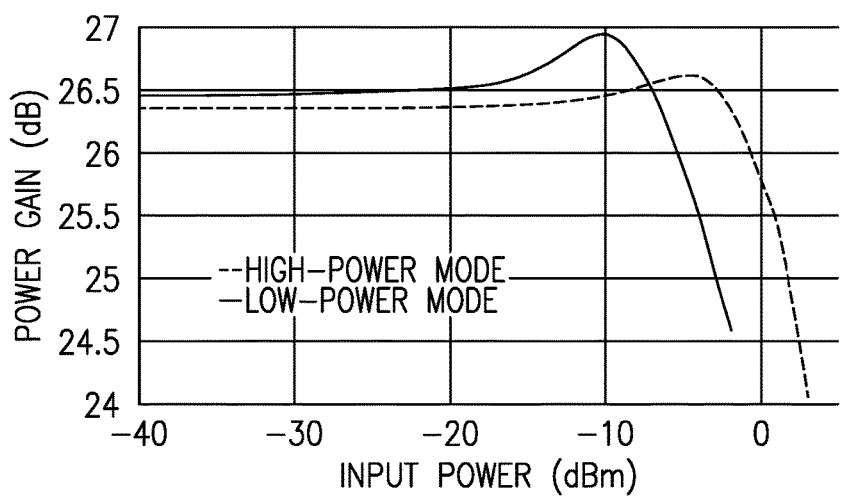
FIG. 15E is a graph showing possible gain versus input power in a power amplifier circuit implementing switchable output matching in accordance with one or more embodiments.
Figure 15F:
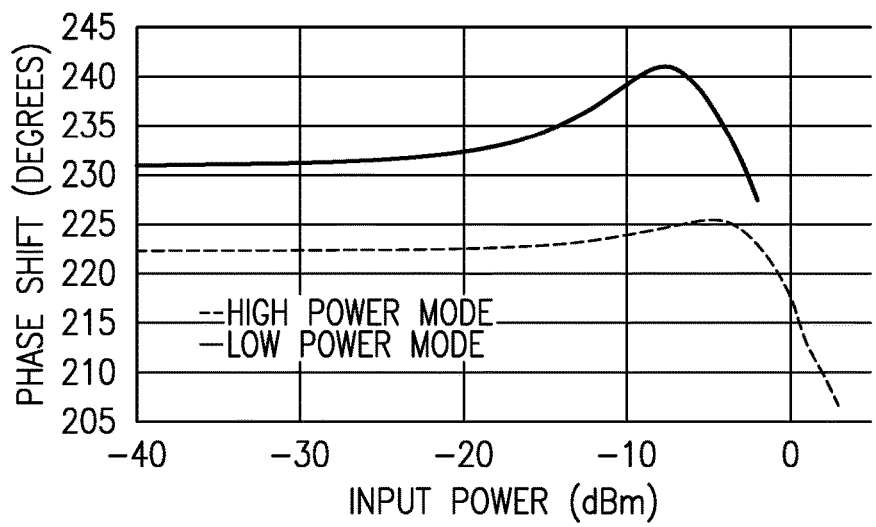
FIG. 15F is a graph showing possible phase shift versus input power in a power amplifier circuit implementing switchable output matching.

FIG. 15E is a graph showing possible gain versus input power in a power amplifier circuit implementing switchable output matching in accordance with one or more embodiments disclosed herein. FIG. 15F is a graph showing possible phase shift versus input power in a power amplifier circuit implementing switchable output matching in accordance with one or more embodiments disclosed herein. With respect to a power amplifier circuit similar to the circuit 530 shown in FIG. 5 and described above, the shape of the gain curve may be at least partially tunable by setting the value of $R_{BB}$, while the shape of the phase shift curve may be at least partially tunable by setting the value of the capacitor C4.

Figure 15G:
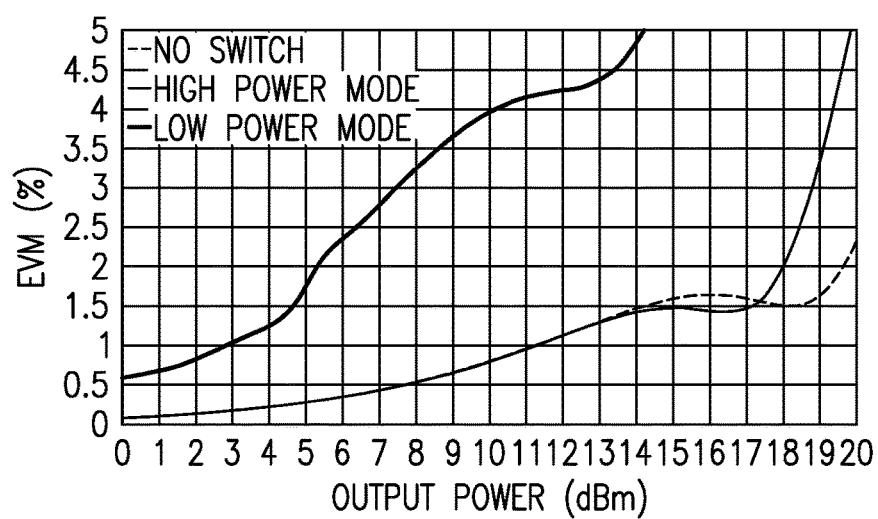
FIG. 15G is a graph showing possible EVM performance in a power amplifier circuit implementing switchable output matching in accordance with one or more embodiments.

FIG. 15G is a graph showing possible error vector magnitude (EVM) in a power amplifier circuit implementing switchable output matching in accordance with one or more embodiments disclosed herein. FIG. 15G includes a curve showing potential EVM characteristics for a power amplifier not implementing switchable output matching for comparison purposes. As shown, in some implementations, a power amplifier not including switchable output matching may provide an EVM of approximately 1.6% at 19 dBm output power. Alternatively, in a high-power mode of a switched power amplifier may produce an EVM of approximately 3.2% at 19 dBm, whereas a low-power mode may result in a performance that is at least slightly worse due to increased variable phase shift in the design. At 13 dBm (e.g., 6 dB backed-off from high power mode), the EVM may be approximately 4.3%.

Module/Die Implementation

Figure 16:
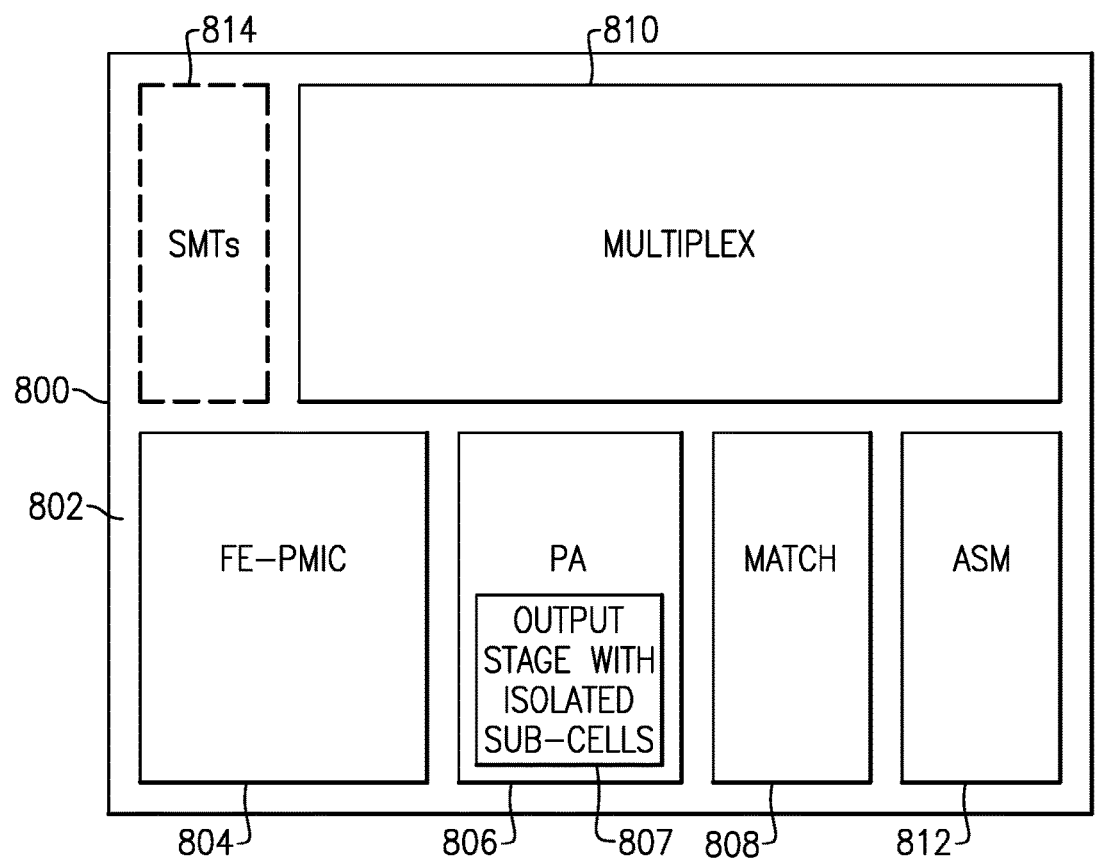
FIG. 16 is a block diagram illustrating a power amplifier module according to one or more embodiments.

FIG. 16 shows that in some embodiments, some or all of power amplification configurations disclosed herein and/or incorporating one or more features as disclosed herein can be implemented, wholly or partially, in a module. Such a module can be, for example, a front-end module (FEM). In the example of FIG. 16, a module 800 can include a packaging substrate 802, and a number of components can be mounted on such a packaging substrate. For example, a power management module 804, a power amplifier module 806, an impedance matching module 808 (which can include switchable matching impedance as disclosed herein), and a multiplexer assembly 810 can be mounted and/or implemented on and/or within the packaging substrate 802. Other components such as a number of SMT devices 814 and an antenna switch module (ASM) 812 can also be mounted on the packaging substrate 802. Although all of the various components are depicted as being laid out on the packaging substrate 802, it will be understood that some component(s) can be implemented over other component(s).

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
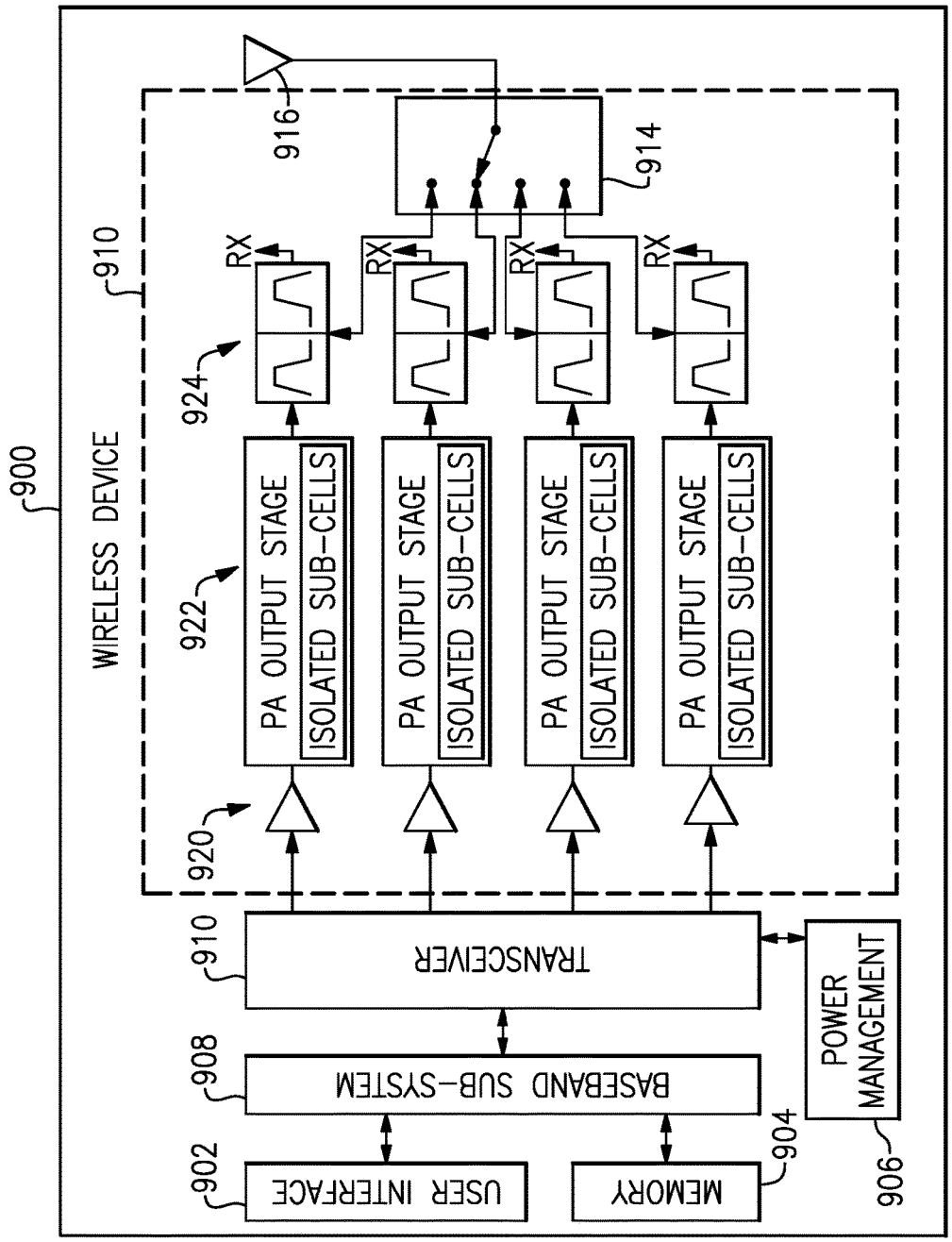
FIG. 17 schematically depicts a wireless device having one or more advantageous features described herein according to one or more embodiments.

FIG. 17 schematically depicts an example wireless device 900 having one or more advantageous features described herein. The wireless device 900 may comprise one or more power amplifiers (PAs) 920 that may receive respective RF signals from a transceiver 910 that can be configured and operated in known manners to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 can also be in communication with a power management component 906 that is configured to manage power for the operation of the wireless device 900. Such power management can also control operations of the baseband sub-system 908 and the module 901.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, outputs of the PAs 920 are shown to be matched via respective match circuits 922, which may have switchable matching load circuitry associated therewith, and further routed to their respective diplexers 924. Such amplified and filtered signals can be routed to an antenna 916 (or multiple antennas) through an antenna switch 914 for transmission. In some embodiments, the diplexers 924 can allow transmit and receive operations to be performed simultaneously using a common antenna (e.g., antenna 916). In FIG. 17, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A cascode power cell for a power amplifier circuit comprising:
    a radio-frequency signal input node;
    a radio-frequency signal output node; and
    a plurality of sub-cells each including a first transistor having a collector coupled directly to the radio-frequency signal output node, each of the plurality of sub-cells further including a second transistor having a collector coupled to an emitter of the first transistor at a connection node, a base coupled to the radio-frequency signal input node, and an emitter coupled to a resistor at an emitter node, the connection nodes for each of the plurality of sub-cells being electrically isolated from one another, and the emitter nodes for each of the plurality of sub-cells being electrically isolated from each other.

2. The cascode power cell of claim 1 wherein the electrical isolation between the connection nodes of the plurality of sub-cells allows the second transistors of the plurality of sub-cells to control current flow through the cascode power cell.

3. The cascode power cell of claim 1 wherein the electrical isolation between the connection nodes of the plurality of sub-cells prevents current hogging by a subset of the plurality of sub-cells.

4. The cascode power cell of claim 1 wherein the first transistor of each of the plurality of sub-cells is a common-base transistor.

5. A cascode power cell for a power amplifier circuit comprising:
    a radio-frequency signal input node;
    a radio-frequency signal output node; and
    a plurality of sub-cells each including a first transistor having a collector coupled directly to the radio-frequency signal output node and a base coupled to a capacitor, each of the plurality of sub-cells further including a second transistor having a collector coupled to an emitter of the first transistor at a connection node, and a base coupled to the radio-frequency signal input node, the connection nodes for each of the plurality of sub-cells being electrically isolated from one another.

6. The cascode power cell of claim 1 wherein the plurality of sub-cells includes eight sub-cells.

7. The cascode power cell of claim 1 wherein the plurality of sub-cells includes ten sub-cells.

8. A cascode power amplifier circuit comprising:
    a radio-frequency signal input node;
    a radio-frequency signal output node; and
    a power amplifier core coupled to the radio-frequency signal input node and the radio-frequency signal output node and including an amplifier cell including a plurality of sub-cells, each of the plurality of sub-cells of the amplifier cell including a first transistor having a collector coupled directly to an amplifier output node, each of the plurality of sub-cells of the amplifier cell further including a second transistor having a collector coupled to an emitter of the first transistor at a connection node, an emitter coupled to a resistor at an emitter node, and a base coupled to an amplifier input node, the connection nodes for each of the plurality of sub-cells being electrically isolated from one another, the emitter nodes for each of the plurality of sub-cells being electrically isolated from each other.

9. The cascode power amplifier circuit of claim 8 wherein the first transistor of each of the plurality of sub-cells is a common-base transistor.

10. A cascode power amplifier circuit comprising
    a radio-frequency signal input node;
    a radio-frequency signal output node; and
    a power amplifier core coupled to the radio-frequency signal input node and the radio-frequency signal output node and including an amplifier cell including a plurality of sub-cells, each of the plurality of sub-cells of the amplifier cell including a first transistor having a collector coupled directly to an amplifier output node and a base coupled to a capacitor, each of the plurality of sub-cells of the amplifier cell further including a second transistor having a collector coupled to an emitter of the first transistor at a connection node, and a base coupled to an amplifier input node, the connection nodes for each of the plurality of sub-cells being electrically isolated from one another.

11. The cascode power amplifier circuit of claim 8 wherein the plurality of sub-cells includes eight sub-cells.

12. The cascode power amplifier circuit of claim 8 wherein the plurality of sub-cells includes ten sub-cells.

13. The cascode power amplifier circuit of claim 8 wherein the electrical isolation between the connection nodes of the plurality of sub-cells allows the second transistors of the plurality of sub-cells to control current flow through the power amplifier core.

14. A radio-frequency module comprising:
    a power amplifier including an amplifier cell including a plurality of sub-cells, each of the plurality of sub-cells of the amplifier cell including a first transistor having a collector coupled directly to an amplifier output node, each of the plurality of sub-cells of the amplifier cell further including a second transistor having a collector coupled to an emitter of the first transistor at a connection node, an emitter coupled to a resistor at an emitter node, and a base coupled to an amplifier input node, the connection nodes for each of the plurality of sub-cells being electrically isolated from one another, the emitter nodes for each of the plurality of sub-cells being electrically isolated from each other.

15. The radio-frequency module of claim 14 wherein the first transistor of each of the plurality of sub-cells is a common-base transistor.

16. A radio-frequency module
    a power amplifier including an amplifier cell including a plurality of sub-cells, each of the plurality of sub-cells of the amplifier cell including a first transistor having a collector coupled directly to an amplifier output node and a base coupled to a capacitor, each of the plurality of sub-cells of the amplifier cell further including a second transistor having a collector coupled to an emitter of the first transistor at a connection node, and a base coupled to an amplifier input node, the connection nodes for each of the plurality of sub-cells being electrically isolated from one another.

17. The radio-frequency module of claim 14 wherein the electrical isolation between the connection nodes of the plurality of sub-cells allows the second transistors of the plurality of sub-cells to control current flow through the power amplifier.

* * * * *